United States Patent
Doolittle

(10) Patent No.: US 10,266,962 B2
(45) Date of Patent: Apr. 23, 2019

(54) DEPOSITION SYSTEMS INCLUDING EFFUSION SOURCES, AND RELATED METHODS

(71) Applicant: Innovative Advanced Materials, Inc., Hampton, GA (US)

(72) Inventor: William Alan Doolittle, Hampton, GA (US)

(73) Assignee: Innovative Advanced Materials, Inc., Hampton, GA (US)

( * ) Notice: Subject to any disclaimer, the term of this patent is extended or adjusted under 35 U.S.C. 154(b) by 0 days.

(21) Appl. No.: 15/495,488

(22) Filed: Apr. 24, 2017

(65) Prior Publication Data

US 2017/0306472 A1 Oct. 26, 2017

Related U.S. Application Data

(60) Provisional application No. 62/327,323, filed on Apr. 25, 2016, provisional application No. 62/349,499, filed on Jun. 13, 2016.

(51) Int. Cl.
*C23C 16/00* (2006.01)
*C30B 23/06* (2006.01)
(Continued)

(52) U.S. Cl.
CPC .......... *C30B 23/066* (2013.01); *C23C 14/243* (2013.01); *C23C 14/28* (2013.01);
(Continued)

(58) Field of Classification Search
CPC .................................................. C23C 14/246
(Continued)

(56) References Cited

U.S. PATENT DOCUMENTS 3,329,524 A 7/1967 Smith, Jr.
3,620,956 A * 11/1971 Gauger ................... C23C 14/50
                                                      118/720
(Continued)

FOREIGN PATENT DOCUMENTS

CN 1519391 A 11/2004
CN 102534507 A 7/2012
(Continued)

OTHER PUBLICATIONS

International Search Report for International Application No. PCT/US2017/29171 dated Sep. 29, 2017, 4 pages.
(Continued)

*Primary Examiner* — Keath T Chen
(74) *Attorney, Agent, or Firm* — TraskBritt

(57) ABSTRACT

A physical vapor deposition system includes a deposition chamber; a wafer support structure disposed within the deposition chamber and configured to support at least one wafer thereon, and at least one effusion cell disposed at least partially outside the deposition chamber and coupled to a wall of the deposition chamber. The at least one effusion cell is configured to generate physical vapor by evaporation or sublimation of material within the at least one effusion cell, and to inject the physical vapor into the deposition chamber through an aperture in the wall of the deposition chamber. The at least one effusion cell is configured such that the at least one effusion cell can be filled with the material to be evaporated or sublimated without removing the at least one effusion cell from the deposition chamber and without interrupting a deposition process performed using the deposition system.

20 Claims, 24 Drawing Sheets

(51) Int. Cl.
*C23C 14/24* (2006.01)
*C23C 14/28* (2006.01)
*C30B 23/00* (2006.01)
*H01J 37/32* (2006.01)

(52) U.S. Cl.
CPC ...... *C30B 23/005* (2013.01); *H01J 37/32082* (2013.01); *H01J 2237/332* (2013.01)

(58) Field of Classification Search
USPC ........................................................ 118/726
See application file for complete search history.

(56) References Cited

U.S. PATENT DOCUMENTS

| | | | |
|---|---|---|---|
| 3,652,330 A | 3/1972 | Anderson | |
| 3,690,638 A | 9/1972 | Roblin et al. | |
| 3,974,002 A | 8/1976 | Casey, Jr. et al. | |
| 4,518,846 A * | 5/1985 | Freeouf | C23C 14/243 118/726 |
| 4,646,680 A | 3/1987 | Maki | |
| 4,690,098 A * | 9/1987 | Mertens | C23C 14/24 118/727 |
| 4,707,333 A | 11/1987 | Gardiner et al. | |
| 4,748,315 A * | 5/1988 | Takahashi | C23C 14/243 118/726 |
| 4,812,326 A | 3/1989 | Tsukazaki et al. | |
| 4,813,373 A | 3/1989 | Demay et al. | |
| 5,041,719 A | 8/1991 | Harris et al. | |
| 5,104,695 A | 4/1992 | Greer et al. | |
| 5,288,327 A | 2/1994 | Bhat | |
| 5,431,735 A | 7/1995 | Briones | |
| 5,733,609 A * | 3/1998 | Wang | C23C 14/048 427/561 |
| 5,932,294 A | 8/1999 | Colombo et al. | |
| 6,011,904 A | 1/2000 | Mattord | |
| 6,030,458 A | 2/2000 | Colombo et al. | |
| 6,162,300 A | 12/2000 | Bichrt | |
| 6,202,591 B1 | 3/2001 | Witzman et al. | |
| 6,342,103 B1 | 1/2002 | Ramsay | |
| 6,467,427 B1 | 10/2002 | Peng | |
| 6,551,405 B1 * | 4/2003 | Thibado | C23C 14/246 118/726 |
| 6,695,954 B2 | 2/2004 | Hong | |
| 7,194,197 B1 | 3/2007 | Wendt et al. | |
| 7,638,168 B2 | 12/2009 | Boroson et al. | |
| 7,760,992 B2 | 7/2010 | Wendt et al. | |
| 8,190,006 B2 | 5/2012 | Wendt et al. | |
| 8,858,714 B2 | 10/2014 | Guyaux et al. | |
| 9,142,413 B2 | 9/2015 | Moseley et al. | |
| 2002/0182885 A1 | 12/2002 | Hwu et al. | |
| 2002/0192499 A1 * | 12/2002 | Tokailin | C09K 11/06 428/690 |
| 2004/0255857 A1 | 12/2004 | Chow et al. | |
| 2006/0153986 A1 * | 7/2006 | Yamamoto | C23C 14/12 427/255.6 |
| 2007/0089676 A1 | 4/2007 | Klemm | |
| 2008/0047487 A1 | 2/2008 | Doolittle et al. | |
| 2010/0031878 A1 | 2/2010 | Priddy et al. | |
| 2010/0122656 A1 | 5/2010 | Long et al. | |
| 2010/0122659 A1 | 5/2010 | Long et al. | |
| 2010/0248416 A1 | 9/2010 | Priddy et al. | |
| 2010/0285218 A1 | 11/2010 | Conroy et al. | |
| 2011/0114665 A1 * | 5/2011 | Chandler | C23C 16/047 118/726 |
| 2011/0165326 A1 * | 7/2011 | Little | C23C 14/0629 427/248.1 |
| 2011/0209995 A1 | 9/2011 | Rasheed et al. | |
| 2012/0094014 A1 | 4/2012 | Ono et al. | |
| 2016/0312356 A1 * | 10/2016 | Jung | C23C 14/26 |

FOREIGN PATENT DOCUMENTS

| | | |
|---|---|---|
| EP | 2524974 A1 | 11/2012 |
| WO | 2008037958 A1 | 4/2008 |
| WO | 2012064748 A1 | 5/2012 |

OTHER PUBLICATIONS

International Written Opinion for International Application No. PCT/US2017/29171 dated Sep. 29, 2017, 14 pages.

Carver, Alexander Gilman, Novel Chlorine-Based Chemistry and Implementation Hardware for the Growth of Lithium Niobate and Related Complex Metal Oxides, A Dissertation Presented to The Academic Faculty at Georgi Institute of Technology, May 2009, 170 pages.

* cited by examiner

DEPOSITION SYSTEMS INCLUDING EFFUSION SOURCES, AND RELATED METHODS

CROSS-REFERENCE TO RELATED APPLICATION

This application claims the benefit of U.S. Provisional Patent Application Ser. No. 62/327,323, which was filed Apr. 25, 2016, and also claims the benefit of U.S. Provisional Application Ser. No. 62/349,499, which was filed Jun. 13, 2016, the disclosures of which are hereby incorporated herein in their entireties by this reference. The subject matter of this application is also related to the subject matter of U.S. application Ser. No. 15/495,458, filed Apr. 24, 2017, and titled "Effusion Cells, Deposition Systems Including Effusion Cells, and Related Methods", the disclosure of which is also hereby incorporated herein in its entirety by this reference.

TECHNICAL FIELD

The present disclosure relates to physical vapor deposition systems including unique high flux, rapid temporal response effusion cells with widely configurable orientations and operational pressures, and to methods of making and using such deposition systems, particularly for integration with large area wafers and platters of wafers.

BACKGROUND

Thin (less than about 10 µm) and thick (greater than about 10 µm) film deposition systems are routinely used in the semiconductor, optical coating, and tool and machinery industries among others. These industries often include well established methods of using physical vapor deposition (PVD), a process by which the material to be deposited is directly evaporated, sputtered or otherwise directly transported from the source to the substrate without the need for a chemical carrier gas to aid transport. When focusing on the high end semiconductor industry (microprocessors, memory, light emitters and other similar high performance devices), PVD is often utilized for the deposition of non-electrical carrier layers (dielectrics) and for metals, but less often for the semiconducting layers themselves. Some lesser performance applications, such as amorphous semiconductors are produced via PVD, but in general, concerns over interconnected trade-offs in uniformity, deposition rates, quality and throughput limit PVD's viability in many important applications. Uniformity is often the primary design parameter with other variables compromised in order to meet the uniformity demands.

Uniformity of the deposited film on the target substrate is the statistical and geometric variation of the thickness of the film or atomic composition of an alloy if so composed, as a function of position on the substrate. PVD systems, such as MBE (molecular beam epitaxy) systems, are known for producing highly uniform films with standard deviations of thickness and composition being 1% or less in some cases. MBE can produce superb quality semiconductor films of almost any known semiconductor, but in high performance applications that require large area deposition for adequate manufacturing throughput, MBE suffers from a serious tradeoff in uniformity at the expense of deposition rates and material utilization efficiency (a measure of how much material is deposited on the wafer versus wasted in off wafer deposition). Given that the flux distribution versus angle to the effusion cell (also referred to as an "effusion source") axis typically follows a cosine to a power (that power typically being less than about three (3), most commonly two (2)), high uniformity in a PVD or, more specifically, an MBE system is obtained by increasing the source-to-substrate distance to a large enough distance so as to obtain a nearly flat flux distribution as shown in FIGS. 1A and 1B. However, since the flux arriving at the substrate reduces by a factor of about $1/L_{SS}^2$, where $L_{SS}$ is the substrate-to-source spacing, this common practice also reduces the deposition rates substantially. In the numeric example shown in FIGS. 1A and 1B, the flux reduces from $2.5 \times 10^{14}$ atoms/cm$^2$-sec to $1.57 \times 10^{13}$ atoms/cm$^2$-sec, for an increase of vertical position, $L_{SS}$, from 30 cm (FIG. 1A) to 120 cm (FIG. 1B) in order to obtain a sufficiently uniform (1%) flux profile. In MBE, positive draft crucibles have been used to improve uniformity, but these have reduced capacity compared to straight wall crucibles and exhibit well-known long-term flux instabilities known as "depletion effects," wherein the surface area of the materials being evaporated change as the material is depleted, changing the flux over time, even at a constant temperature. All open-ended crucibles, whether positive draft (conical) or straight walled, exhibit some measure of long-term flux instabilities due to depletion effects and are prone to short-term flux instabilities when the external shutter is opened or closed. These short-term external shutter flux transients are well known to result from the transient cooling or heating of the effusion cell when the partially heat-reflecting shutter is removed from the effusion cell opening, thus allowing more (open shutter) or less (closed shutter) heat loss from the cell that is compensated for by transient variations driven by the Proportional Integral Derivative (PID) control system, which applies more (open shutter) or less (closed shutter) power to the resistive filaments to return to the desired constant temperature. The uniformity at 30 cm (FIG. 1A) is not tolerable for a 300 mm wafer (shown as the thick upper black line in the figure). When one backs off the effusion cell to 120 cm, a typical distance for commercial MBE systems, the uniformity as shown in FIG. 1B drastically improves, but the growth rate as measured by the flux at the wafer surface drops significantly due to the natural $1/L_{SS}^2$ dependence of flux on source-substrate distance, $L_{SS}$. Thus, MBE is an incredibly useful research tool when using small substrates that allow short distances, L, but suffers dramatically from scaling issues and has led to minimal market share as wafer/platter sizes have increased.

Physical vapor deposition is a well-known deposition process in which elements or molecules to be deposited on a substrate within a deposition chamber are supplied via evaporation or sublimation processes. While physically different processes, the words "evaporation" and "sublimation" are used interchangeably herein and depend only on the material to be deposited. The deposition chamber is enclosed and typically under vacuum. In other words, at least some measurable amount of gas is removed from within the deposition chamber. The deposition chamber is typically formed from steel, aluminum, other metal or glass and defines a physical boundary between an outside region, typically air, and the internal region wherein the gas is partially removed.

When gas is at a temperature above absolute zero Kelvin, each molecule or atom of gas has a specific kinetic energy defined by $\frac{1}{2} mv^2$, where m is the mass of the gas particle (an atom or molecule) and v is the particle's velocity. When these energetic particles collide with the chamber walls, they exert a force on the chamber walls. This force exerted on the chamber walls is manifest as a pressure and is often described in units such as pounds per square inch (psi), pascals or torr among other units commonly known by those skilled in the art. The amount of force exerted depends on the area of the chamber, the number of collisions that occur, and, thus, the density and kinetic energy of the gas.

When one considers a system wherein the pressure outside of the chamber is different than that inside the vacuum chamber, a net force acts on the chamber walls. If the pressure outside the chamber is less than that inside the chamber, a force is exerted that tries to expand or even rupture the chamber. In this case, the chamber is referred to as a pressure chamber. If the pressure inside the chamber is less than the pressure outside of the chamber, a net force is exerted that tends to try and compress or even crush the chamber. In this case, the chamber is often referred to as a vacuum chamber and must be robustly built so as to withstand the forces exerted on it. From this point forward, for shorthand, the "chamber" will be referred to as a "vacuum chamber" or "chamber."

In many applications, such as semiconductor, optical coatings, tool coatings, and various biomedical applications, the processing of products include, but are not limited to, thin film deposition, etching and annealing. It is, thus, desirable to not only evacuate a chamber, but to also introduce to the vacuum chamber a controlled flow of a known gas. This gas may supply a product used in the deposition, etching, annealing or, in general, used for processing the product produced in a vacuum environment. The vacuum may provide a means of processing not possible without the vacuum, such as plasma processing, or might merely provide a pressure differential so as to allow a gas to flow and thus be delivered to the product under process. Alternatively, the vacuum may provide a means of reducing undesirable background impurity concentrations so as to prevent contamination of the product or prevent undesirable chemical or thermal reactions. Those skilled in the art are aware of a multiplicity of reasons for using a vacuum to process a product, with these mentioned here only given as examples and not intended to be exhaustive.

Since it is not typically possible to remove all of the gas particles in a chamber, some measurable amount of residual gas exists defining a vacuum chamber pressure as measured typically relative to atmospheric pressure at sea level (1 atmosphere equals 760 torr). When gas is removed such that the pressure is between about 760 torr and about $1 \times 10^{-3}$ torr, the vacuum is said to be "medium vacuum." When the pressure is further reduced to a range of between about $1 \times 10^{-3}$ torr about $1 \times 10^{-8}$ torr, the vacuum is said to be "high vacuum" or "HV." When the pressure is further lowered to below about $1 \times 10^{-8}$ torr, the vacuum is said to be "ultra-high vacuum" or "UHV."

The geometric size of the chamber, regardless of whether that chamber is a vacuum chamber, tube, orifice or any other enclosed volume, defines the certain key features of how the gas flows through a system. Thus, all enclosed volumes are simply referred to as a "chamber." When gases are at sufficiently low pressure, the particles do not frequently collide with one another. The average distance for which the particles travel before they collide with each other is commonly known by those skilled in the art as the "mean free path" (between collisions). When the chamber walls are separated by distances less than the mean free path (k), the collisions with the chamber walls dominate over inter-particle collisions in determining the resistance to gas flow via momentum transfer to and from the gas and chamber walls. This mode of gas flow is referred to as "molecular flow."

When the mean free path of the gas is less than the dimensions of the chamber walls, the inter-particle collisions dominate the resistance to gas flow via momentum transfers from particle to particle. This mode of gas flow is known as "viscous flow" and behaves much like a fluid wherein the particles act to slow down and scatter other particles with lesser impedance effect from the chamber walls.

A gas can convert from one mode of flow to another as it travels through the vacuum system. For example, the gas can be delivered in a small tube (one form of a vacuum chamber) wherein its pressure and the tube dimensions define it to be in the viscous flow mode. The gas can subsequently be injected into a larger chamber, wherein its pressure and chamber dimensions define the gas to be in the molecular flow mode. A dimensionless quantity defined by the ratio of the mean free path to chamber major dimension known to those skilled in the art as the "Knudson number" ("K"), defines which mode the gas is in. If the Knudson number is greater than approximately one (1), the gas tends toward molecular flow behavior, whereas if the Knudson number is less than approximately one (1), the gas tends toward viscous flow. Those skilled in the art recognize that no clear boundary exists to define viscous vs. molecular flow and, thus, a region defined as "mixed flow" is often used to define the transition in flow characteristics when the Knudson number is approximately one (1).

Often, the processing speed of a vacuum tool is determined in part by the "gas throughput" ("Q"), which is related to the molecular flux J. Throughput is a measure of the total mass flow through a system. Thus, higher mass flow equates to more gaseous species entering the chamber. In a deposition system, higher Q or J is desirable so as to increase the deposition rates and thus process throughput. Throughput Q is given in common units of torr-liters per second, standard (atmospheric pressure) cubic centimeters per second, standard liters per second or other units known to those skilled in the art. Molecular flux J is given in units of either number of atoms/($cm^2$-second) or grams/($cm^2$-second). In some cases, this throughput is defined at a given pressure at which the chamber is intended to operate, while in other cases, it is defined relative to atmospheric pressure (standard pressure).

The chamber pressure and the gas throughput are related by the chamber conductance C. The chamber, tube or orifice conductance is a measure of the inverse resistance to the flow of a gas and most often is measured in units of liters per second (L/S). Consequently, when in the molecular flow regime, the conductance is defined solely by the dimensions of the chamber, which act to restrict the flow, with inter-particle collisions having little effect on restricting the gas flow. Likewise, the conductance of the chamber in the viscous flow regime is dependent on the pressure of the gas, given that the gas pressure determines the number of collisions and, thus, the impedance to gas flow. In general, the relationship between Q, C and pressure P, is $$Q=CP, \qquad \text{Equation 1)}$$

where C is a constant dependent on chamber dimensions for molecular flow and C is a variable dependent on both chamber dimensions and on pressure for viscous flow. A more accurate equation for viscous flow considers the pressure dependence of the conductance resulting in $$Q=F(P^2_{up}-P^2_{down}), \qquad \text{Equation 2)}$$

where $P_{up}$ is the pressure in the upstream flow (source of the gas flow) and $P_{down}$ is the pressure in the downstream of the gas flow (in the vacuum chamber or in the pump supplying vacuum to the chamber). The difference between the upstream and downstream pressures is often great enough that the downstream pressure can be ignored. Thus, Equation 2) can be reduced to Equation 1) by making $C=F/(2\times P_{average})\sim F/(2\times P_{up})$.

A vacuum requires some sort of pump to remove the gas from the vacuum chamber to create the vacuum. The flow of gases into the chamber would result in a pressure increase unless a vacuum pump continuously removed the gas. Thus, every vacuum system contains at least one, often more than one, vacuum pump. The performance of a vacuum pump is described by a quantity known as the pumping speed S, and having units identical to that of the chamber conductance. Thus, the pumping speed of a pump is dependent on pressure in the viscous flow regime and independent of pressure in the molecular flow regime.

Since the pumping speed and the chamber conductance have the same unit, one can describe the combined effect of each by replacing the conductance C in Equations 1 and 2 by an effective conductance $C_{eff}$, $$1/C_{eff}=1/C+1/S.\qquad\text{Equation 3)}$$

Likewise when several (n) chambers, large and small, as well as a pump are connected in a series gas flow arrangement, the effective conductance is found by $$1/C_{eff}=1/C_1+1/C_2+1/C_n+1/S.\qquad\text{Equation 3)}$$

When a pump having a high pumping speed is connected to a series of chambers of various dimensions, the lowest conductance chamber, i.e., the one with the smallest characteristic dimensions, will determine the overall conductance and, thus, dictate the throughput and pressure of the system. Thus, if a high-speed pump is connected through a small opening (limited conductance) to a vacuum chamber, the opening limits the overall conductance and, thus, the throughput and achievable pressure. This feature will prove important in understanding embodiments of the present disclosure, and will lead to ability to ignore the pumping speed S in Equations 3 and 4, resulting in the system flux throughput being determined by the pressure of the sources and the combined conductances of the delivery system (i.e., the effusion cell as described herein).

Under molecular flow conditions, the conductance is independent of pressure since the gas molecules are less likely to interact with one another. A circular orifice (an aperture with an opening that has a thickness substantially smaller than the diameter of the opening) has a conductance of:

$$C=11.6\pi D^2/4;\text{ or}$$

$$C=11.6(\text{Cross-sectional Area}_{orifice}).\qquad\text{Equation 5)}$$

The conductance of a tube is:

$$C_{tube}=11.6(D^3/L);\text{ or}$$

$$C_{tube}=11.6(\text{Cross Sectional Area}_{tube})(4D/\pi L),\qquad\text{Equation 6)}$$

where D is the orifice/tube inner diameter in cm, L is the tube length in cm, and P is pressure in torr. Note, for this molecular flow case, conductance C is independent of pressure.

For viscous flow for a tube, conductance C is given by:

$$C=180(D^4/L)P_{average};\text{ or}$$

$$C=180(\text{Cross sectional Area}_{tube})(4D^2/\pi L)P_{average}.\qquad\text{Equation 7)}$$

A more accurate means of characterizing gas flow in the viscous flow regime than simply $Q=C_{eff}P$ is $$Q=F(P^2_{upstream}-P^2_{downstream})\qquad\text{Equation 8)}$$

where $P_{upstream}$ is the pressure upstream of the orifice and $P_{downstream}$ is the pressure downstream of the orifice, F is related to conductance, C by the relationship:

$$F=C/(2P_{average}),\text{ where}$$

$$P_{average}=0.5(P_{upstream}+P_{downstream}).\qquad\text{Equation 9)}$$

The relationship between C and F for the viscous flow tube can be proven as follows:

$$Q = C(P_{upstream} - P_{downstream})$$

$$P_{average}Q = C(P_{upstream} - P_{downstream})P_{average}$$

$$P_{average}Q = C(P_{upstream} - P_{downstream})\frac{(P_{upstream} + P_{downstream})}{2}$$

$$P_{average}Q = C(P^2_{upstream} - P_{upstream}P_{downstream} + P_{upstream}P_{downstream} - P^2_{downstream})\frac{1}{2}$$

$$Q = \left(\frac{C}{2P_{average}}\right)(P^2_{upstream} - P^2_{downstream})$$

$$Q = F(P^2_{upstream} - P^2_{downstream})$$

$$\therefore F = \left(\frac{C}{2P_{average}}\right)$$

In Equations 5 through 7, all conductances are measured in L/Sec when dimensions are expressed in cm, pressure in Torr, and where the pre-factors to each of the above conductance equations account for the unit transformations. Non-circular apertures and tubes have similar expressions well known in the art but are less common.

The area dimensions of the openings of the tube and the orifice affect the conductance. Thus, for high mass flow as described by Equation 1), it is desirable to have large diameter tubes and orifices, maximizing the conductance.

Since embodiments of the present disclosure utilize several robust mechanical connections designed to support substantially larger mechanical loads than prior crucible and effusion cell designs, and since these connections might be required (in some cases) to be liquid tight so as to not allow liquefied evaporate material to escape, a means of joining thick and heavy parts in vacuum without creating a "virtual leak" may be required. A virtual leak is a pocket of trapped gas (not liquid) in a volume connected to the vacuum via a low conductance pathway. Such a pathway is often a small or highly constricted opening or a long narrow pathway such as a thread. Methods well known in the art to avoid virtual leaks include center boring bolts and screws to be used in blind tapped holes so as to provide an alternative gas pathway or slotting the female threads of a joint, allowing a more direct (straighter and shorter) path for gases to escape. Unfortunately, while slotting a female thread is necessary for allowing the trapped gas to escape, it also allows an opportunity for the liquid evaporate material to "wick" through the slot and escape the joint. Thus, in this disclosure, some critical joints where liquid could otherwise escape can be coated, as described later, on the outside of the joint so as to seal the joint. Such a joint is mechanically sound by the threaded connection and liquid tight via the external coating. The threads of the union may also incorporate a gas port relief (a cut along the threads) and a shorter male thread than female socket so as to eliminate trapped gases along the threads or in the base of the mechanical union.

As is well known in the art, an MBE system consists of one or more heated crucibles filled with evaporate (or sublimation) materials configured in a vacuum chamber so as to direct the evaporate material toward a substrate to be condensed as a solid film. Mechanical shutters are typically placed outside of the crucibles so as to interrupt or allow the flux of evaporate material to deposit on the substrate. Crucibles are typically designed to be thin-walled materials (typically about 0.035 inch thick) often made of Pyrolytic Boron Nitride (PBN) or other suitable high purity, heat transparent material or, in some cases, heat opaque refractory metals, oxides such as alumina, beryllium oxide, or graphite. In general, the crucibles can be removed and replaced, making them interchangeable and, thus, not material specific. Since it is desirable to adjust the evaporate flux to achieve various rates of deposition or to mix evaporate materials in specific flux ratios to produce composite thin films, in almost all cases, the MBE crucibles are thin so as to minimize the thermal mass and, thus, to maximize the response time of changing temperatures and, thus, changing the desired evaporate flux.

It is known that the flow leaving an effusion cell containing a vapor or gas with pressure P and proceeding into a vacuum via a restricted, sufficiently thin opening (an orifice) of cross-sectional area A is given by:

$$J=PA/(2\pi mkT)^{1/2}, \quad \text{Equation 10}$$

where the opening is sufficiently thin to be classified as an orifice by having a thickness much thinner than the opening width and with: J=flow, m=molecular mass in kG of the evaporated species, k=Boltzmann constant, T=absolute temperature in the cell, P=pressure in the cell linked with the temperature T related by a law in the form:

$$P=Ye^{(-Ea/kT)}, \quad \text{Equation 11}$$

Y being a characteristic constant of the evaporated material and Ea is an activation energy associated with the evaporation or sublimation process.

The exact flux of molecules at a distance from the orifice, $L_{SS}$, into the vacuum is a complex function of many variables, but is known in the art. Some of these variables include J, orifice size, A, orifice shape, and even local pressure (P is a function of position z, where $0 \le z \le L_{SS}$), which changes as the molecular beam expands or focuses as it processes into the vacuum to substrate location point $L_{SS}$.

Lambert's approximation is thus useful and says an incident flux F on a substrate located at a distance $L_{SS}$ from the orifice diminishes as the square of the distance, $L_{SS}$, from the orifice:

$$F=HJ/(L_{SS}^2), \quad \text{Equation 12}$$

where H is a proportionality factor.

Known methods of creating this flux typically involve a crucible containing the material to be vaporized, a filament heater to apply heat to the crucible, and a beam-blocking mechanism (shutter or valve). Crucibles can be made from a variety of materials but are selected for their ability to not react chemically with the source material to be vaporized, and minimal outgassing of undesirable contaminant gases. The crucible is most often a container with one open end, but in some cases, is a sealed container with a nozzle or orifice designed to constrict or shape the flux leaving the cell.

The vast majority of effusion cells use a mechanical shutter mounted exterior to the crucible consisting of a blade placed in the path of the molecular beam of the flux leaving the effusion cell. These exterior mounted shutters reduce the delivered flux, but at higher pressures where scattering or chamber desorption occurs, this flux reduction may only be a factor of about 10 when in the closed position. This blade can be made of W, Ta, Mo, PBN, Graphite or any other material of sufficiently limited reactivity with the evaporate material and is typically not heated, resulting in a continually increasing thickness of deposited material on the shutter. The deposited material can accumulate to such thicknesses as to cause shutter actuation problems (sluggish or locked behavior) and can even touch the cold surfaces surrounding the shutter, forming a "solidified material weld" between the shutter and the cold surfaces, preventing shutter actuation. The blade is typically actuated via a linear retraction/insertion mechanism or a rotary motion along an arc path substantially less than 360°, typically from 90° to 180°. Closing an open shutter requires the shutter to reversely traverse the path it traveled during its opening cycle, which is a slow and often unwieldy process.

Likewise, in a rare number of effusion cells, a plunger style valve is used to plug and then open the effusion cell crucible's cylindrical tube, so as to cut off and then restore the molecular flux. Such a design allows for a heated valve body, which minimizes the material accumulation and provides a more positive closing, which lowers the amount of flux "leaking" past the valve/shutter. However, even these plunger valve methods of flux modulation require the same path to be reversely traversed, resulting in slow flux modulations similar to the external shutter configurations. These methods of molecular flux interruption were designed to simply start and stop the beam occasionally and are known in the MBE field to produce difficulty when rapid, frequent shutter/valve actuations are required. Methods that require rapid flux modulations include the growth of multiple layers of thin alternating compositions known as superlattices or when supplying frequent pulses of metal to increase surface migration as found in metal-modulated epitaxy (MME) processes, such as those disclosed in, for example, U.S. Pat. No. 9,142,413 titled "Systems and Methods for Growing a Non-Phase Separated Group-III Nitride Semiconductor Alloy." Thus, neither the exterior-mounted "blade style" shutter nor the internally mounted "plunger style valve" can provide the needed speed of actuation desirable when rapid pulse-modulated flux growth is required. These temporal constraints of the shutter/valve systems are exacerbated as the deposition rate increases. For example, in the MME case, shutter actuation may be every 2 seconds for a growth rate of about 1-2 µm/hour but increase in frequency to every 0.1 to 0.2 seconds for a growth rate of about 10-50 µm/hour.

One of the primary reasons for using an MBE system is to maintain an ultra-high vacuum background to minimize the incorporation of undesirable impurities. Most often, these impurities are in the form of undesirable oxygen and carbon gases, primarily from heated metals that act as near infinite sources of these undesirable contaminant gases. Extreme care is given to the maintenance and operation procedures to ensure very low base pressures are achieved daily. For example, a commercial MBE system used to grow III-Nitride materials may commence each operational day with a base pressure of about $6\text{-}8\times10^{-11}$ Torr (near the lower limit of what can be read by an ion gauge pressure sensor). However, as soon as any of the effusion cells or substrate heaters are increased to their operational temperature from idle values (about 200° C.), the base pressure in the system may rise from this quiescent value to as high as $10^{-9}$ Torr (and, momentarily, even higher).

MBE is performed using effusion cells heated by resistive metal filaments and substrate holders typically made from metallic Ta, W, or zirconia-stabilized Pt. These resistive metal filaments, ceramic parts holding the resistive metal filaments, and gas trapping rolls of metal used to reflect heat and minimize the amount of heat escaping the effusion cell or substrate heater, however, can result in introduction of impurities into the evaporate flux. Metals are an infinite source of carbon- and oxygen-bearing gases and tend to outgas CO, $CO_2$ and $O_2$ gases, and other undesirable elements, which need to be pumped away or they will be incorporated into the growing film. Furthermore, the substrate heaters and effusion cells are in direct line of sight to the growth substrates. Thus, all the elaborate cryoshields and gettering pumps, useful for scattered or desorbed gases, have little effect on lowering these gas concentrations before they encounter the growth substrates.

BRIEF SUMMARY

In some embodiments, the present disclosure includes a physical vapor deposition system comprising a deposition chamber; a wafer support structure disposed within the deposition chamber and configured to support at least one wafer thereon, and at least one effusion cell disposed at least partially outside the deposition chamber and coupled to a wall of the deposition chamber. The effusion cell is configured to generate physical vapor by evaporation or sublimation of material within the at least one effusion cell, and to inject the physical vapor into the deposition chamber through an aperture in the wall of the deposition chamber. The effusion cell is configured such that the effusion cell can be filled with the material to be evaporated or sublimated without removing the at least one effusion cell from the deposition chamber and without interrupting a deposition process performed using the deposition system.

In additional embodiments, the present disclosure includes a physical vapor deposition system comprising a deposition chamber, a wafer support structure disposed within the deposition chamber and configured to support at least one wafer thereon, at least one effusion cell configured to generate physical vapor by evaporation or sublimation of material within the at least one effusion cell and to provide the physical vapor within the deposition chamber, and a coiled cooling tube disposed within the deposition chamber. The coiled cooling tube surrounds and encloses a volume of space within the deposition chamber between the wafer support structure and the at least one effusion cell.

In additional embodiments, the present disclosure includes a physical vapor deposition system comprising a deposition chamber, a wafer support structure disposed within the deposition chamber and configured to support at least one wafer thereon, and at least one effusion cell configured to generate physical vapor by evaporation or sublimation of material within the at least one effusion cell and to provide the physical vapor within the deposition chamber, and a mixture of two or more elemental materials to be evaporated or sublimated within the at least one effusion cell.

In yet further embodiments, the present disclosure includes a physical vapor deposition system comprising a deposition chamber, a wafer support structure disposed within the deposition chamber and configured to support at least one wafer thereon, and at least two effusion cells. The two effusion cells are diametrically opposed relative to a central axis of the wafer support structure and located a distance from the center of a support surface of the wafer support structure. A ratio of the distance from the wafer or wafer support structure to a diameter of the wafer support structure is between about 0.5 and about 2.0. Each effusion cell of the two effusion cells is located a lateral distance from a central axis of the wafer support structure.

Further embodiments of the present disclosure include methods of manufacturing, and methods of operating deposition systems as described herein.

For example, in some embodiments, the present disclosure includes a method of performing a physical vapor deposition process in which matter is emitted from a least one effusion cell disposed at least partially outside a deposition chamber through an aperture in a wall of the deposition chamber and toward at least one wafer on a wafer support structure within the deposition chamber. The emitted matter is deposited on the at least one wafer.

In yet further embodiments, the present disclosure includes a method of performing a physical vapor deposition process in which matter is emitted from each of at least two effusion cells toward at least one wafer on a wafer support structure within a deposition chamber. The two effusion cells are diametrically opposed relative to a central axis of the wafer support structure and located a distance from the center of a support surface of the wafer support structure. A ratio of the distance to a diameter of the wafer support structure is between about 0.5 and about 2.0. Each effusion cell of the two effusion cells is located a lateral distance from a central axis of the wafer support structure. The emitted matter is deposited on the at least one wafer.

DETAILED DESCRIPTION

Figure 1A:
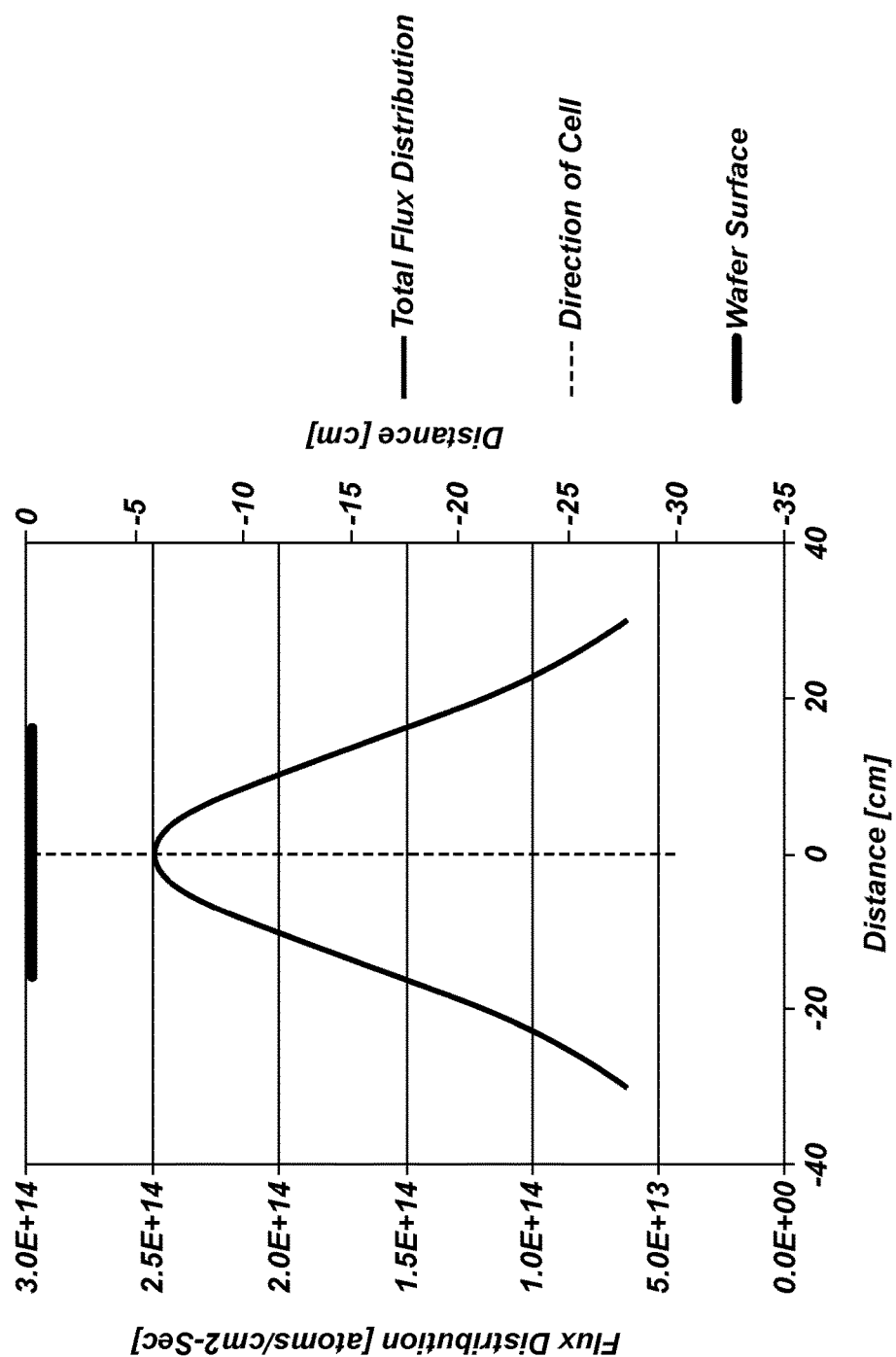
FIG. 1A is a graph illustrating a flux distribution provided by an effusion cell as a function of radial distance from a center of the effusion cell and substrate for a first separation distance between the effusion cell and substrate.
Figure 1B:
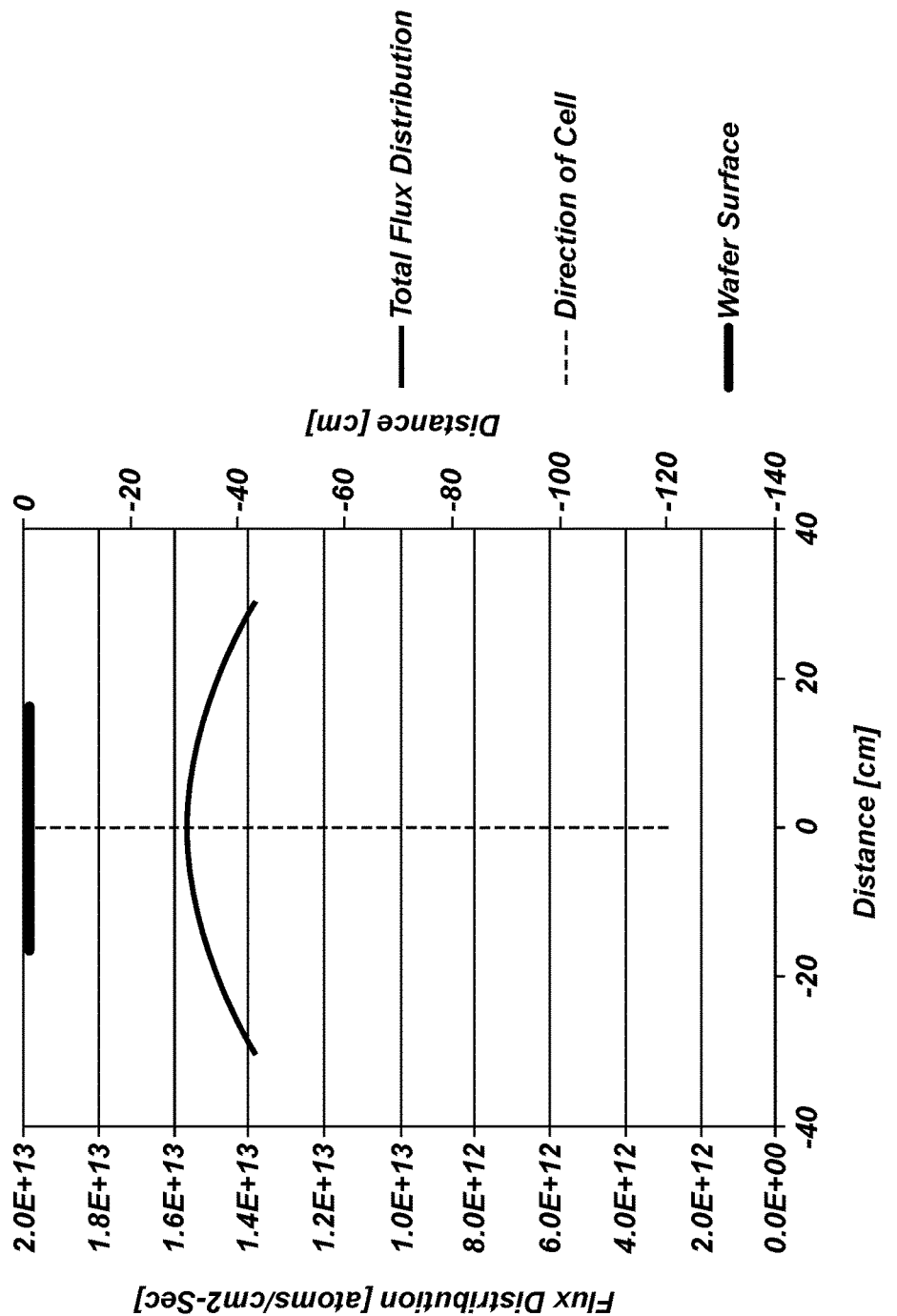
FIG. 1B is a graph illustrating a flux distribution provided by an effusion cell as a function of radial distance from a center of the effusion cell and substrate for a second separation distance between the effusion cell and substrate.
Figure 2A:
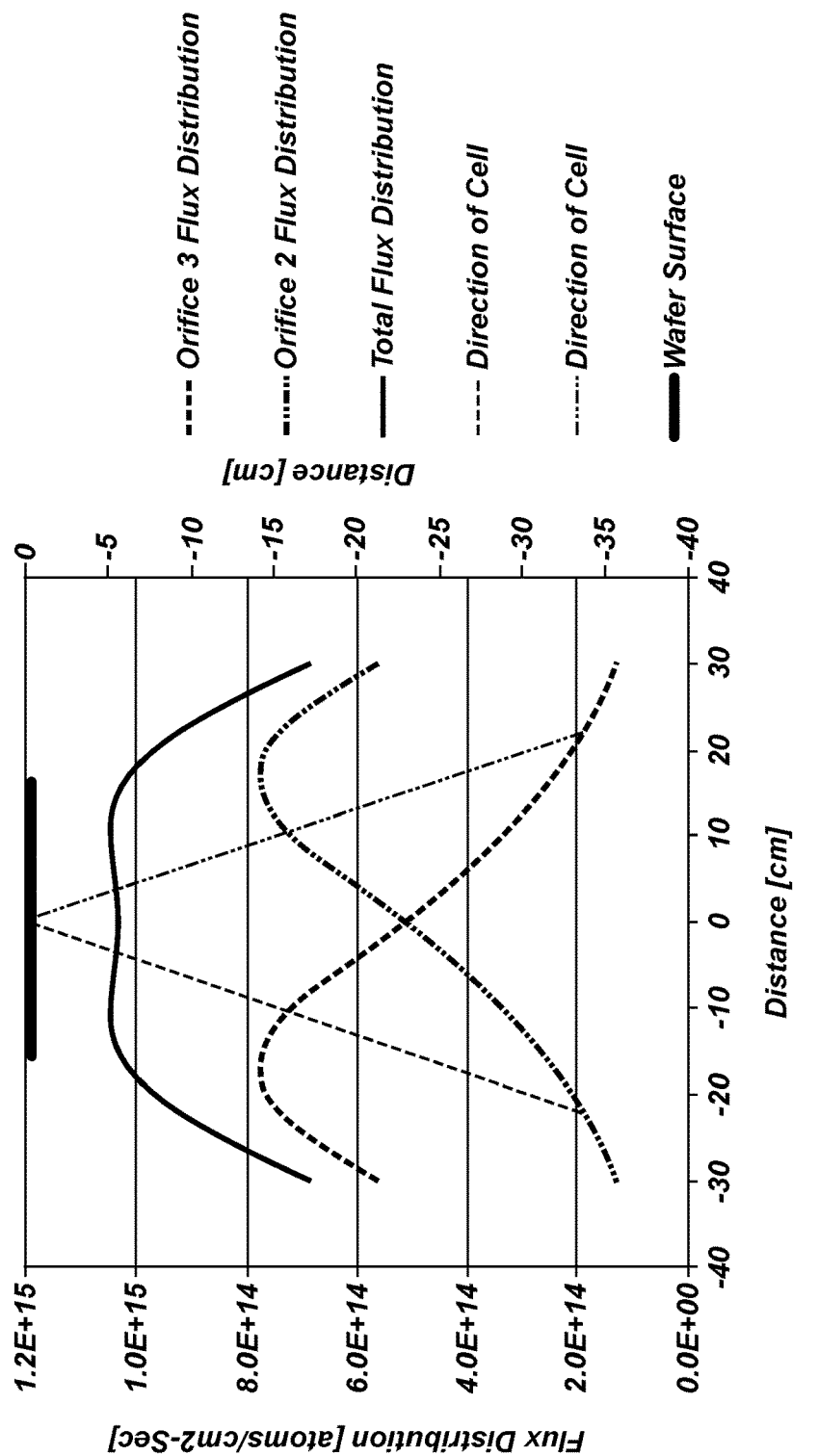
FIG. 2A is a graph illustrating a combined flux distribution provided by a combination of two diametrically opposed effusion cells as a function of radial distance from a center of the effusion cells and substrate for a separation distance between the effusion cells and substrate. This graph also represents the flux distribution of a single effusion cell when the substrate rotational speed is substantially fast compared to the linear growth rate.
Figure 2B:
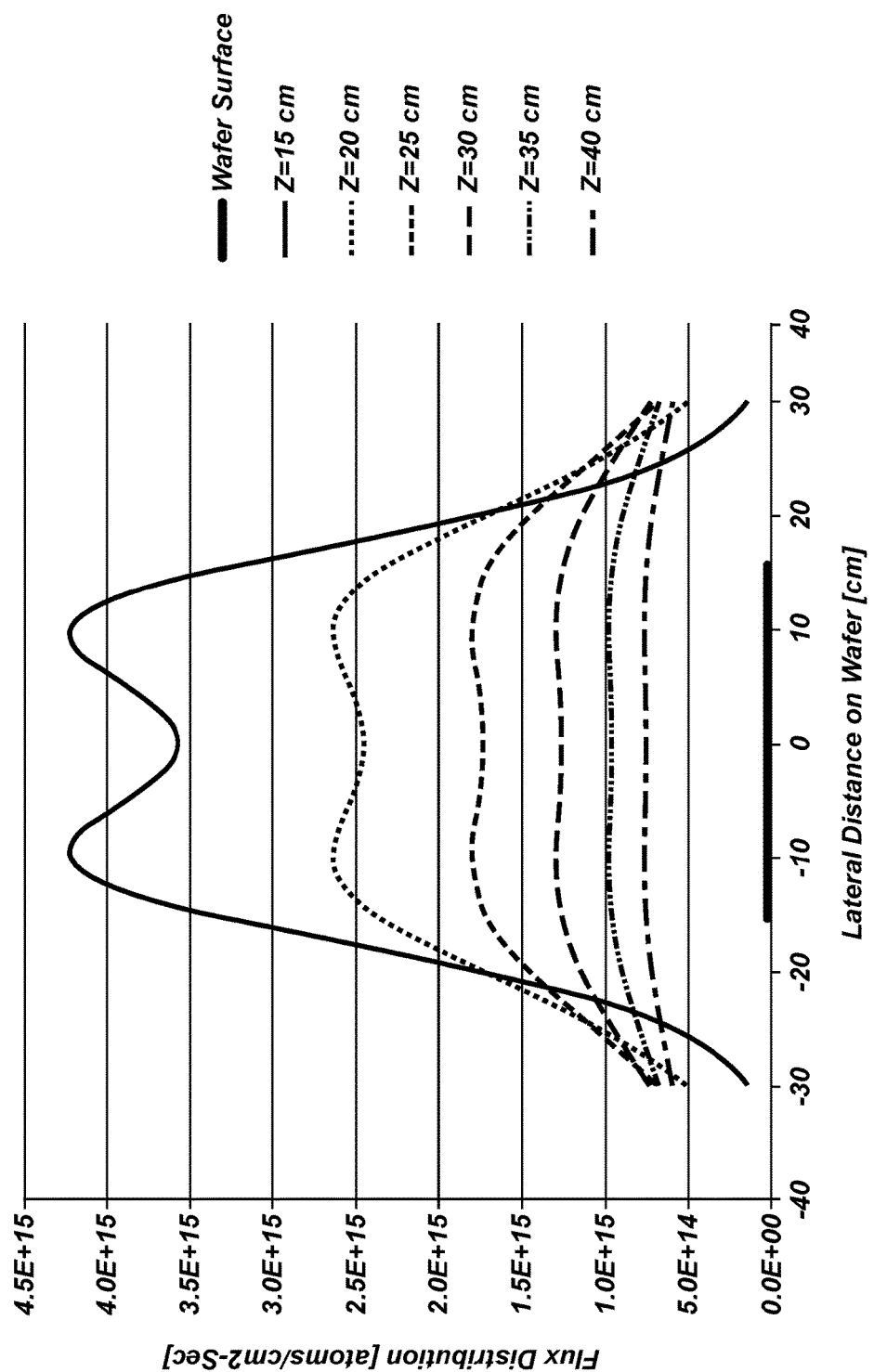

The illustrations included herewith are not meant to be actual views of any particular effusion cells or semiconductor substrate processing systems, but are merely idealized representations that are employed to describe embodiments of the present disclosure. Elements and features common between figures may retain the same numerical designation.

Embodiments of effusion cells of the present disclosure can be utilized in the application known as "Molecular Beam Epitaxy" ("MBE") or, more generally, in the vacuum deposition of thin and thick films generally known as "physical vapor deposition" ("PVD"), or in any other processing system wherein an enclosed vacuum chamber is used to process one or more substrates, and wherein an effusion cell is used to provide an evaporate into the vacuum chamber for processing of the substrate(s). Because the operational pressure range of the embodiments of effusion cells described herein may be higher than that defined as "Molecular Flow," the effusion cell can operate with improved flexibility relative to previously known effusion cells, specifically at higher evaporate or ambient pressures and, thus, the effusion cells may be employed in processing systems other than MBE systems.

In contrast to traditional "MBE-style" effusion cells, the evaporate flux provided by embodiments of effusion cells described herein is adjusted primarily by the variation of the duty cycle and duration of rapid pulsing of the flux, and only slowly responds to flux variations resulting from temperature changes. Thus, thicker, more robust crucibles, less prone to fracture, may be utilized in embodiments of the present disclosure. The temperature of the crucibles can also be varied to effect flux changes, but at a slower rate, with higher thermal stability when a constant temperature is desired.

The effusion cells described herein can have utility in deposition chambers and processes in which deposition is carried out under medium vacuum, high vacuum (HV), or ultra-high vacuum (UHV) pressure ranges. In general, the primary desirable features of a deposition system are high deposition rates, excellent uniformity, wide operational pressure range, low impurity incorporation and good control over composition of a multi-component film.

In addition to all these desirable features, the disclosure includes the capability of reducing spitting of droplets, providing rapid temporal response of the flux at high deposition rates with in-situ material reloading capability, the ability to adjust the conformal coverage and the provision for reverse gas flows and in-situ plasma cleaning of the chamber and or wafers, which increases system operational times (uptime). Furthermore, embodiments of effusion cells disclosed herein utilizes a unique "out of vacuum" reloading design that allows for in-situ reloading without exposing the system to atmosphere, which removes material reloading from among the factors limiting the campaign length of the system. Additionally, embodiments of effusion cells of the present disclosure are capable of relatively rapid modulation of the molecular flux (e.g., activation and deactivation of the flux interruption mechanism) even at high flux rates. Embodiments of effusion cells as described herein reduce the outgassing caused by previously known effusion cell designs, and may even eliminate the source of such harmful gases by removing all unnecessarily heated line of sight hot metals from the design.

The present disclosure also includes a system that combines certain specific geometry relationships with multiple diametrically opposed, novel PVD effusion cells at shorter than conventional source-substrate distances so as to provide simultaneously both high uniformity and high flux without spitting of material as is common to most other conventional effusion cells. Additionally, each source has multiple nozzles which can be directed at various parts of the wafer and can rapidly modulate the flux so as to supply pulses of material instead of the normal constant flux. These pulses can be timed to work effectively with substrate rotation to further enhance uniformity or can be used without substrate rotation and in conjunction with multiple directional effusion cells and/or multiple directional nozzles in each source to effectively "spray" flux pulses at various locations on the wafer forming a composite uniform deposition profile. The system also provides new process opportunities in the form of higher tolerance to pressure, extending the useful deposition range into the low vacuum regime, providing corrosive gas tolerance and the ability to clean the interior of the deposition chamber in-situ.

Figure 3:
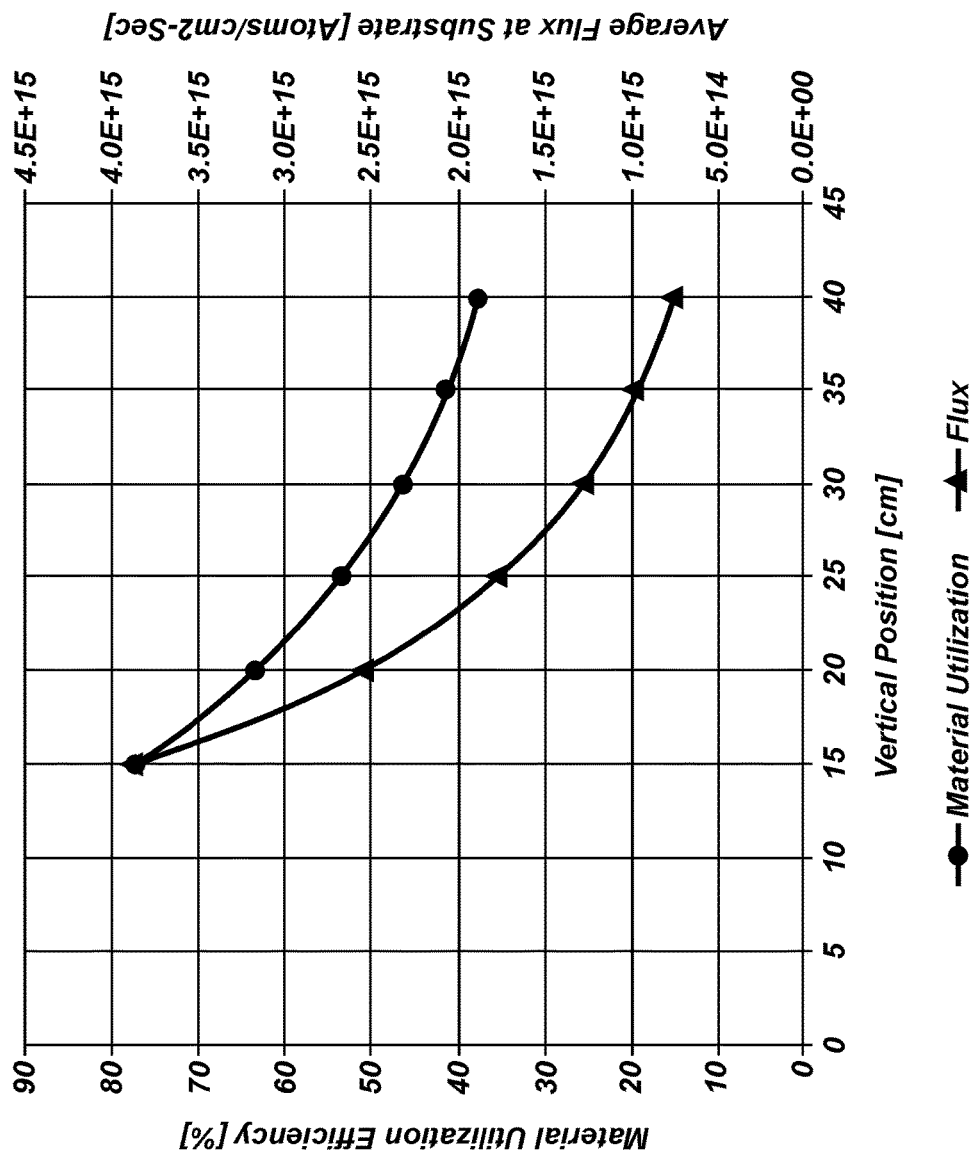
FIG. 3 is a graph of the material utilization efficiency and average flux at the wafer surface for a representative case of a 300 mm diameter wafer, a large (hot source) 1e18 atoms/$cm^2$-sec source flux and with a z-source spacing varied from 15 to 40 cm.

FIG. 3 shows the variation in flux and material utilization efficiency deposited on a 300 mm wafer as the vertical source–wafer spacing, Z, increases ($L_{SS}^2 = Z^2 + X^2$ in this example) and an optimal value of the horizontal source placement (X) and focal point on wafer (cell angle) was determined by non-linear least squares fitting. Flux varies as about $1/L_{SS}^2$. Likewise, the material utilization efficiency (MUE) decreases as the source-substrate spacing $L_{SS}$ increases, as more of the flux is deposited off wafer. Competitive technologies such as MOCVD often have a MUE of about 30%-35%. Thus, it is desirable to achieve at least this value if not better, for example, 40+%. Thus, for the target example application of a 300 mm wafer, a source-substrate spacing $L_{SS}$ of 35 cm or less is desirable. At these values of $L_{SS}$, the flux is significantly reduced from the value at the source and thus, a very high flux source is needed, specifically one designed to provide high fluxes without material spitting. Such a source is disclosed in U.S. Provisional Patent Application Ser. No. 62/327,323, filed Apr. 25, 2016 and titled "Effusion Cells, Deposition Systems Including Effusion Cells, and Related Methods," which is incorporated herein in its entirety by this reference. In the present deposition system, to achieve the desired 1% uniformity: one source is found to be adequate up to about 2 µm/hr with single element/binary/multi-nary deposition; two diametrically opposed effusion cells are found to be adequate up to 10 µm/hr for multi-nary deposition from corresponding pairs of effusion cells and similarly; four quadrature arranged effusion cells are adequate for up to 50 µm/hr deposition rates all while maintaining a rotational speed of 240 rpm or less. Depending on the substrate to source distance $L_{SS}$, four or more diametrically opposed effusion cells can be utilized without substrate rotation and still maintain adequate uniformity (1% or better).

While the deposition system can be operated with a continuous flux of material, the effusion cells used are primarily intended to be used to supply extreme amounts of flux in pulses so as to achieve an excess of material for the purposes of increasing surface diffusion rates. Increased surface diffusion rates results in improved crystal quality without the need for increasing the temperature, resulting in an improved thermal budget. In turn, this lower thermal budget facilitates the growth of pure phases from otherwise immiscible alloy compositions. The pulses from this new source are timed so as to be out of phase with the rotation such that a constant "smearing" of the deposited material is achieved instead of the same location on the wafer receiving the same pulse at each revolution. This phasing of the pulses is a unique aspect of the pulsed source and is not needed in a continuous source application.

Figure 4:
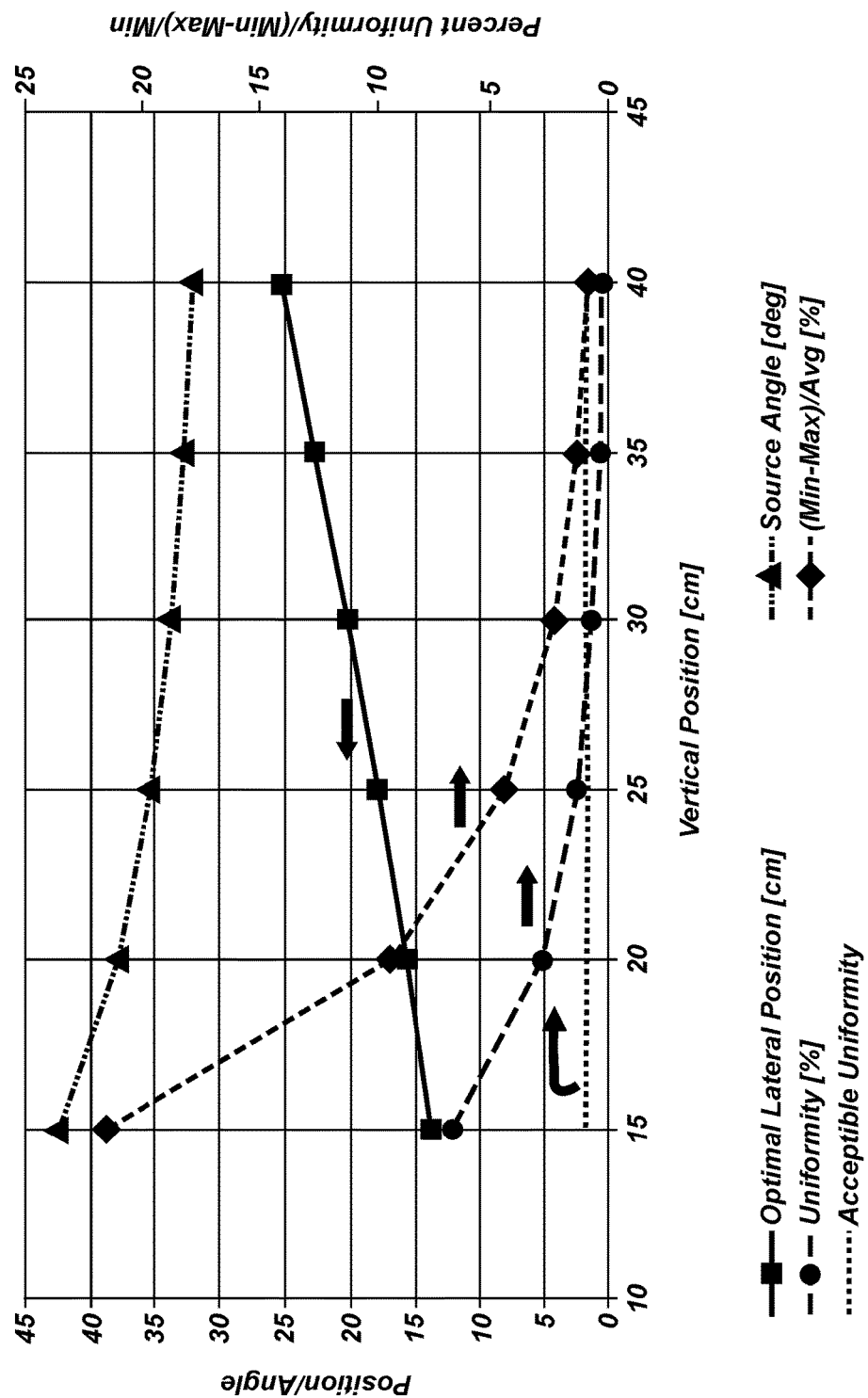
FIG. 4 is a graph of the non-linear least squares determined optimal lateral Position (x), optimal effusion cell angle, Uniformity (flux standard deviation/average flux) and (Minimum Flux–Maximum Flux)/Average Flux for the cases described in FIG. 3.
Figure 5:
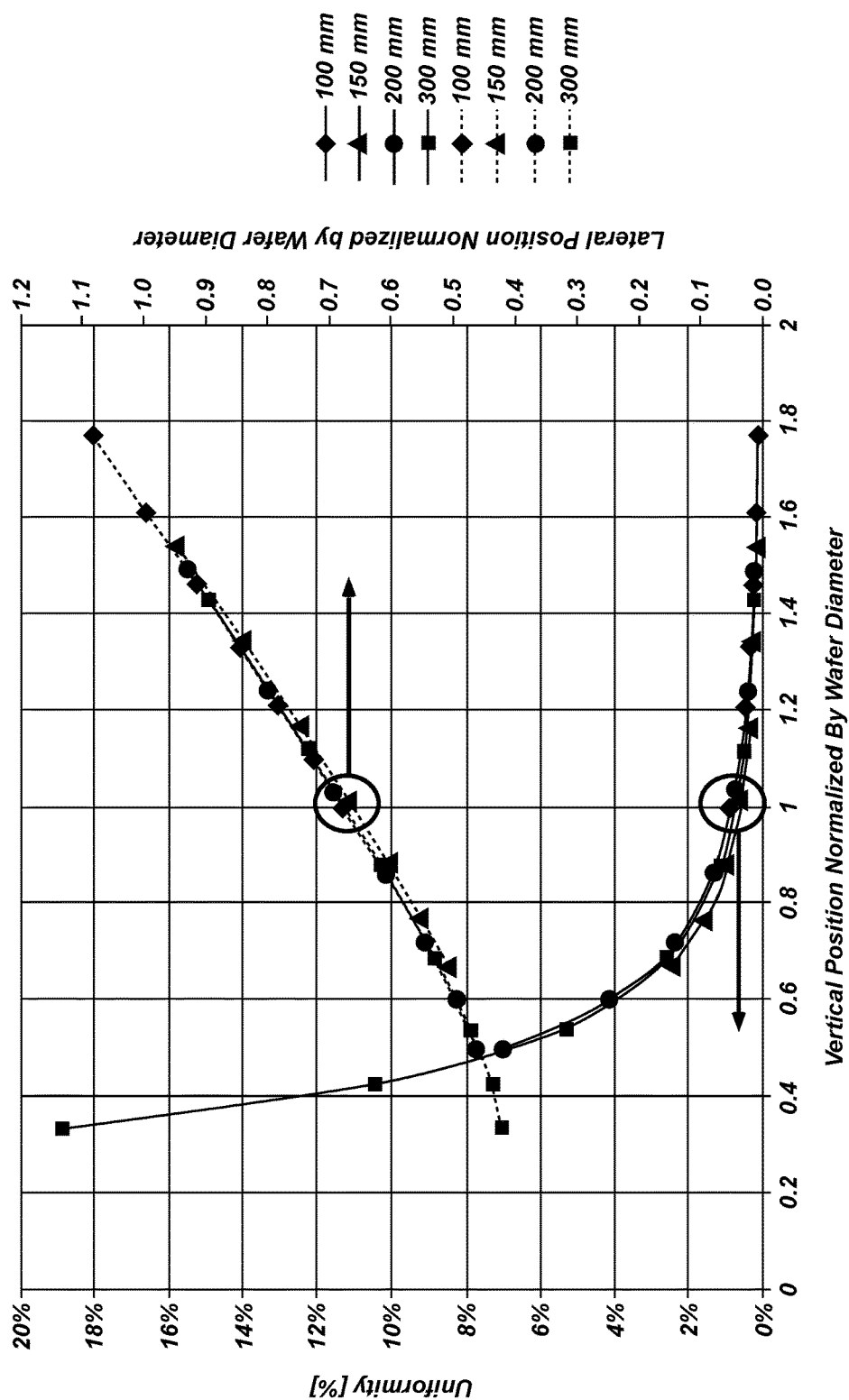
FIG. 5 is a set of graphs of the uniformity and optimal lateral position determined through non-linear least squares minimization of the uniformity (best) for several wafer sizes (100, 150, 200 and 300 mm diameter) and several vertical source positions normalized by wafer diameter. Each data point has both the effusion cell position and angle (focus on the wafer) optimized for minimal (best) uniformity.

FIG. 4 shows the results of modeling for an optimized source location and angle (which determines the focal point on the wafer) so as to achieve the best possible uniformity over a 300 mm wafer as the vertical source-substrate spacing, Z, is varied for two diametrically opposed effusion cells as shown in FIG. 3. The optimal lateral position, X, and source angle are determined for each vertical source-wafer location (horizontal axis) by means of a non-linear least squares algorithm summing up the flux across a wafer and calculating standard deviations, average flux, uniformity, minimum and maximum flux and MUE. The average flux was found to vary as $1/L^{1.93}$, very close to the expected $1/L^2$ relationship. This optimally designed source location data was used to create FIG. 3 as well. To achieve the benchmark performance metric of 1% uniformity and approximately 1% Min-Max/Min, vertical positions of at least 35 cm are needed for a 300 mm wafer. Given the MUE constraints specified above, which limited the vertical position to less than about 40 cm, the optimal vertical spacing for a 300 mm wafer, wherein uniformity is the primary criteria with high flux and MUE greater than 40% being secondary constraints, results in a lateral position of about 22 cm and a focal point near the wafer center. Similar constraints can be imposed on other wafer/platter diameters arriving at similar geometry. Specifically, as shown in FIG. 5 for 100, 150, 200 and 300 mm diameter wafers/platers when using the diametrically opposed source configuration, if the uniformity constraint is to be better than about 1%, the ratio of wafer diameter to optimal lateral source position (X) is about 60% for all wafer sizes. This, in turn, sets the MUE to about 49%. Likewise if a more aggressive constraint is used, about 1% (Min–Max)/Min, then the ratio of wafer diameter to optimal lateral source position is about 75% for all wafer sizes. This, in turn, sets the MUE to about 39%. For each of these results, this makes the source to substrate distance, $L_{SS}$, approximately equal to or slightly greater than the wafer diameter. Thus, in embodiments of the present disclosure, the ratio of the source-substrate distance $L_{SS}$ to the wafer diameter may be between about 0.5 and about 2.0, between about 0.75 and about 1.50, or between about 0.85 and about 1.25.

To put the difference in the dimensions of the present disclosure compared to existing PVD systems in perspective, a Veeco Gen II commercial MBE with a 3" (7.62 cm) diameter wafer has a source to substrate distance of 7.185 inches (18.25 cm) or a source-substrate distance to wafer diameter ratio about 2.4. These elongated dimensions are common to all existing MBE systems so that the single source, asymmetric design can meet the uniformity requirements at the expense of the deposition rates (flux). It is noted that when a single source is used in the same geometry as defined by FIGS. 3, 4 and 5, as long as the growth rate is sufficiently low relative to the angular speed of rotation, similar uniformity results can be obtained although the optimal angle of the source (focal point on the wafer) varies from the center location slightly.

One important aspect of a high deposition rate PVD source is that the source should not "spit" metal clusters out of the source. In any thin film deposition system, but particularly in MBE, the upper deposition rate is limited by the onset of spitting from the effusion cell. Spitting can result from convection flows (sometimes inaccurately referred to as "boiling") established in a heated melt, which increase in ferocity as temperature is raised, resulting in liberation of droplets of liquid that can reach the substrate and result in defects ranging from metal droplets to dried chemically reacted droplet alloys that in some applications are often described as "oval defects" for their identifying geometry. Source spitting can also occur at lower temperatures when some evaporate condenses on the crucible wall and collects. This collection is aggravated when using heat transparent materials such as PBN because the walls of the crucible above the melt are not as hot as the melt itself, encouraging condensation of droplets on the walls. These condensed droplets can fall back into the melt "splattering" liquid out of the cell. Either of these mechanisms or other similar mechanisms known in the art can result in source spitting that can incorporate defects in the deposited film. At moderate rate deposition, spitting defect production has been reduced by heating the orifice, or lip as in "hot lip" designs of the crucible to prevent material condensation or using reentrant crucible shapes. These designs suffer from inefficient heat absorption, and limited temperature differential compared to the melt region providing only modest reduction of spitting compared to standard open cell designs.

A "campaign length" is the time an MBE or PVD system can be used for growth before the system has to be opened for maintenance, most often material reloading. Almost all currently used effusion cells utilize a single opening design wherein the material is evaporated through the same opening through which the material is loaded. This requires that the effusion cell be removed from the system to reload expended material. In processes requiring high purity, such as deposition of semiconductor material where one impurity in approximately 100 trillion semiconductor atoms is considered "impure," this breaking of vacuum and subsequent system contamination via $H_2O$, CO, $O_2$, $CO_2$ and other contaminating gases found in the atmosphere, causes an expensive and time consuming "post-maintenance cleanup" cycle to be employed. Often, the entire system is baked at elevated temperatures as high as 250° C. for several days to drive out the impurities into various pumps. This is deemed as one of the primary industrial limitations of the MBE process and is the primary reason many manufacturers select competitive technologies instead of MBE. In the select few effusion sources that do not load materials through the same opening through which they evaporate the material, the design is such that breaking vacuum to load the materials is still required, resulting in similarly limited campaign length.

PVD methods that require rapid flux modulations include the growth of multiple layers of thin alternating compositions known as superlattices or when supplying frequent pulses of metal to increase surface migration as found in metal-modulated epitaxy (MME) processes, such as those disclosed in, for example, U.S. Pat. No. 9,142,413 titled "Systems and Methods for Growing a Non-Phase Separated Group-III Nitride Semiconductor Alloy." Thus, neither the exterior-mounted "blade style" shutter nor the internally mounted "plunger style valve" found in prior effusion cells can provide the needed speed of actuation desirable when rapid pulse-modulated flux growth is required. These temporal constraints of the shutter/valve systems are exacerbated as the deposition rate increases. For example, in the MIME case, shutter actuation may be every two seconds for a growth rate of about 1-2 μm/hour, but if growth rates were to increase to about 10-50 μm/hour, the frequency would also increase to about every 0.1 to 0.2 seconds. Such high growth rates are desirable.

Figure 6A:
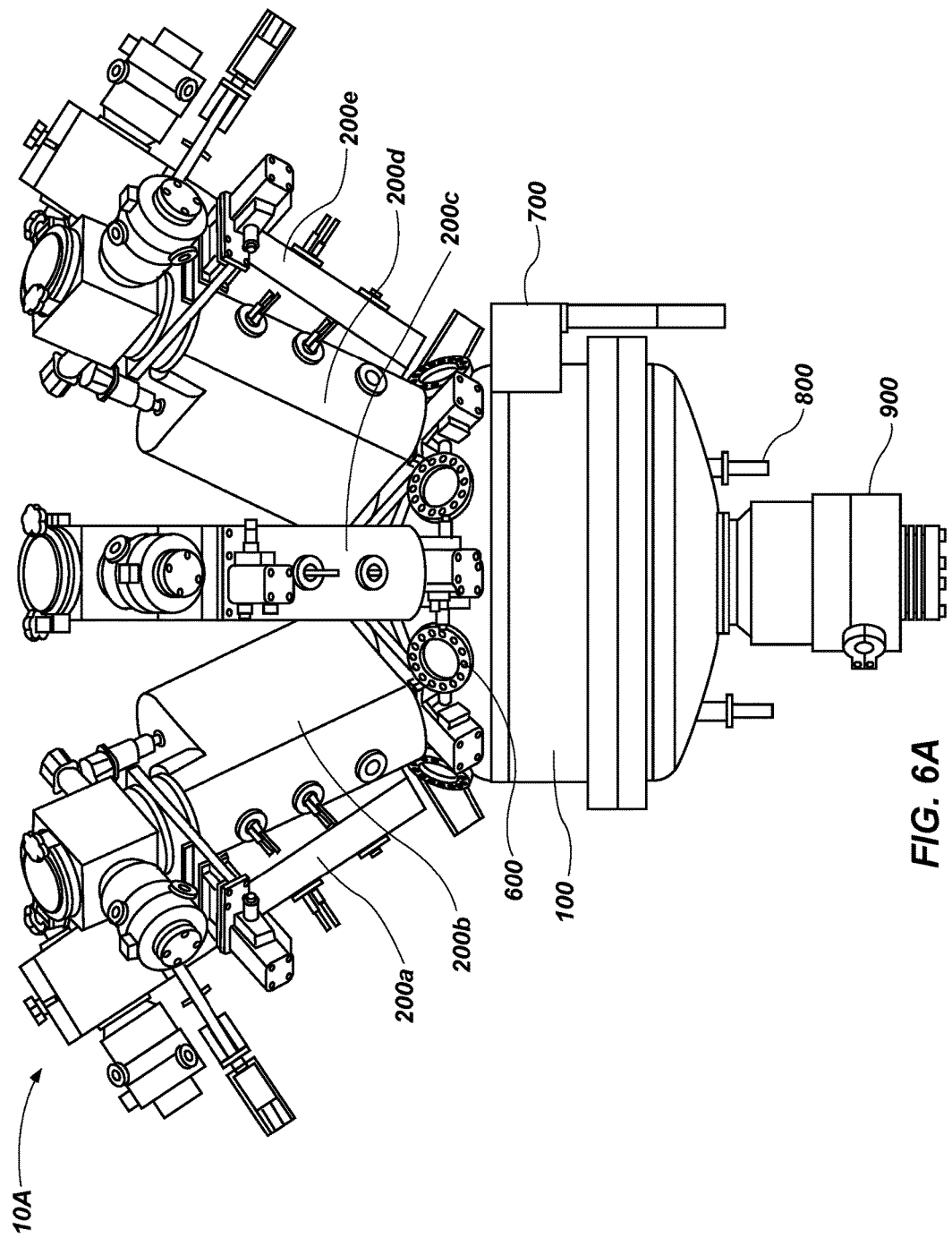
FIG. 6A is a perspective view of an embodiment of a deposition system of the present disclosure having a wafer up, effusion cell down configuration compatible with standard silicon processing cluster tools.
Figure 6B:
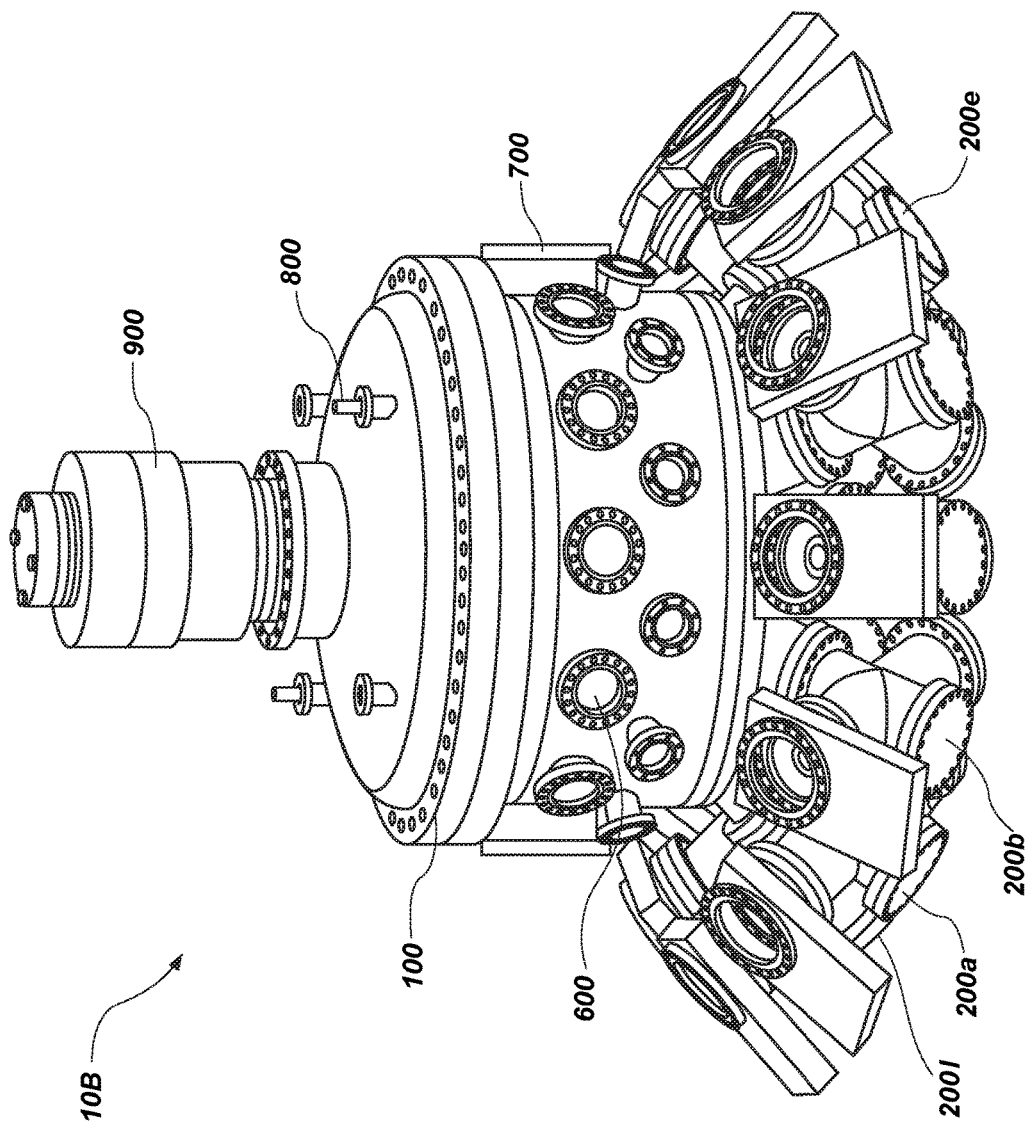
FIG. 6B is a perspective view of an embodiment of a deposition system of the present disclosure having a wafer down, effusion cell up configuration compatible with standard MBE equipment and transfer systems.

FIGS. 6A and 6B show various possible embodiments of physical vapor deposition systems 10A and 10B, respectively, of the present disclosure. Each of the deposition systems 10A-10B includes a vacuum deposition chamber 100, which can be of any shape or size convenient to the application. Shown in FIGS. 6A and 6B are round deposition chambers 100, but for integration with various standard semiconductor processing equipment in a "cluster tool" or with a Front Opening Unified Pod (FOUP) or similar equipment, a polygonal shape having at least one flat face may be employed.

The deposition chambers 100 may be constructed of stainless steel, aluminum or other materials common to vacuum systems. Stainless steel is the most common material, but materials like aluminum that weakly couple to RF electromagnetic energy and easily conduct heat are advantageous provided the internal surfaces are adequately treated to form thin films of aluminum oxide, aluminum nitride or other "passivated" surface layers as are well known in the art so as to minimize undesirable outgassing.

The deposition systems 10A, 10B may include one or more effusion cells 200. The effusion cells 200 may be disposed at least partially outside the deposition chamber 100, and may be coupled to a wall of the deposition chamber 100. The effusion cells 200 are configured to generate physical vapor by evaporation or sublimation of material within the effusion cells 200, and to inject the physical vapor into the deposition chamber 100 through an aperture in the wall of the deposition chamber 100.

The effusion cells 200 described herein may be mounted to the deposition chamber 100 in various configurations (the delivery axis can be from 0 to 180 degrees relative to vertical). FIG. 6A shows a deposition system 10A with eight (only five are visible in the perspective of FIG. 6A) downward facing effusion cells 200a, 200b, 200c . . . 200e. This downward configuration is particularly useful for interfacing with standard semiconductor processing equipment wherein the wafer is processed face up. Using this downward facing configuration, the deposition system 10A can interface with a variety of standard semiconductor equipment including various standardized wafer handling equipment, cluster tools and front opening unified pods (FOUPs). In this way, the deposition system 10A can be integrated into a series of automated processes increasing its overall utility and broadening its application.

FIG. 6B shows an alternative embodiment of a deposition system 10B of the present disclosure, which includes twelve (nine of which are visible in the perspective of FIG. 6B) effusion cells 200a-200l. The effusion cells 200a-200l face upward so as to process a wafer that is downward facing, as is common in MBE applications. All the components of this deposition system 10B are flipped 180 degrees relative to the deposition system 10A of FIG. 6A, and, thus, are not described in detail herein. However, it is clear that inverted versions of each component described herein are easily achievable as an alternative embodiment.

By increasing the substrate-to-effusion source distance Lss, more effusion cells can be used in the deposition systems 10A, 10B, which will result in higher uniformity, but at the cost of reduced flux.

Figure 6C:
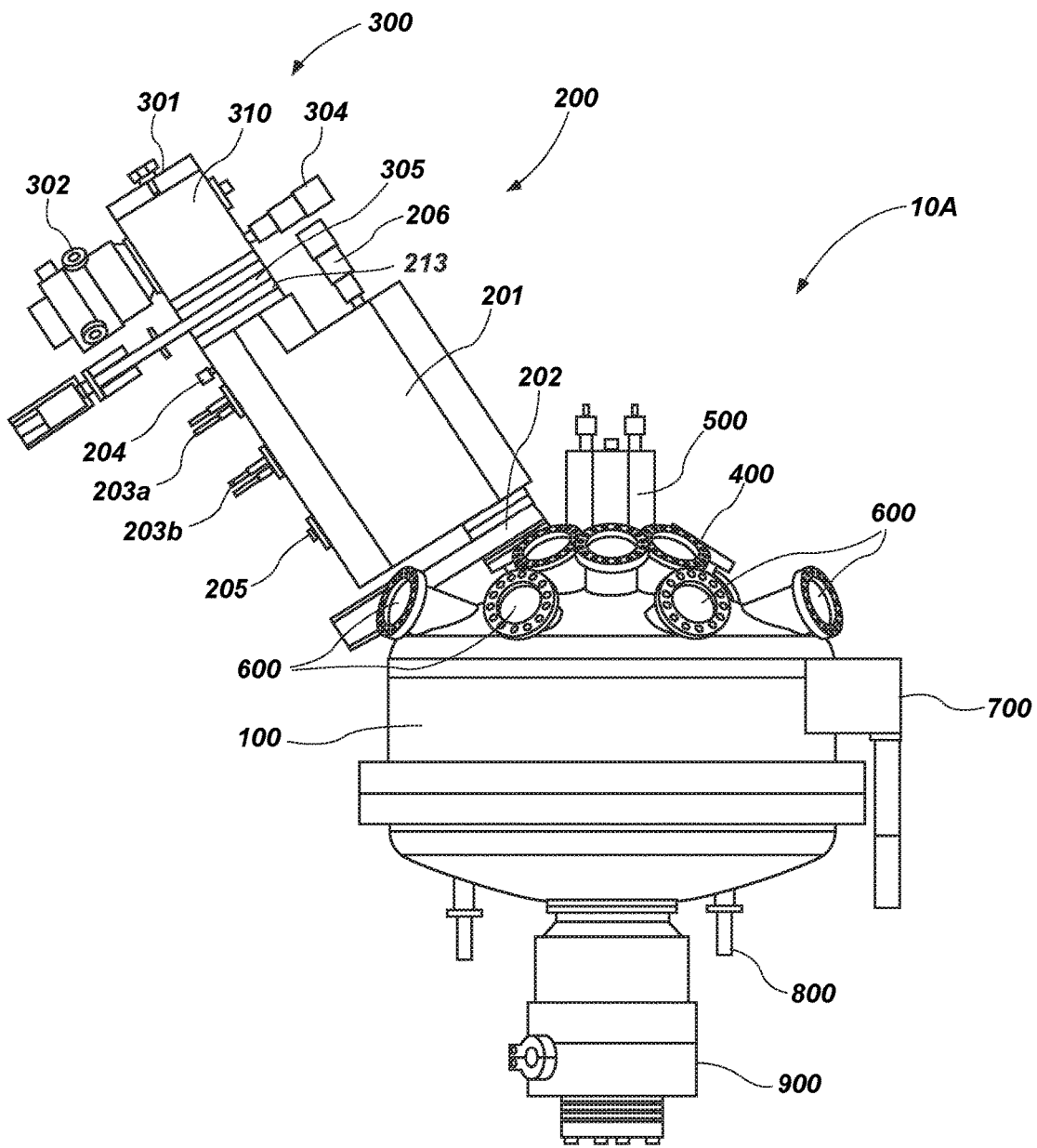
FIG. 6C is a perspective view of an embodiment of a deposition system of the present disclosure having a wafer up, effusion cell down configuration compatible with standard silicon processing cluster tools as shown in FIG. 6A, but with all but one source removed so other details are visible.

FIG. 6C shows the same deposition system 10A of FIG. 6A, but with all but one effusion cell removed so that details of the deposition system 10A can be visualized.

The deposition systems 10A, 10B of FIGS. 6A-6C may include: optional diagnostic tool access ports 600; wafer transfer ports 700 and associated valves, which can be mounted to standard wafer transfer systems (both automated and manual); one or more coiled cooling tubes 800 designed to absorb the extra heat load exerted on the system by the hot evaporates; and a vacuum pump 900 for providing vacuum conditions within the deposition chamber 100, of which, several acceptable pump types are well known in the art, and the particular type employed may depend on the deposition process conditions and parameters.

FIG. 6C further shows an in situ material reloading system 300 of the effusion cells 200, as well as the vacuum ports 400 where each effusion cell 200 is mounted in the deposition chamber 100. FIG. 6C also illustrates a plasma source 500 useful for film processing and wafer and system cleaning. The placement of the vacuum source ports 400 may be governed by the aforementioned criteria, but in general follows the relationship depicted in FIG. 5, and, for 1% or better uniformity, may be located at a distance from the wafer support structure equivalent or greater than the diameter of the wafer support structure and directed toward the center of the wafer support structure (or optionally the midpoint of the radius of the wafer support structure when rapid rotation is employed). Furthermore, it is advantageous to use pairs of diametrically opposed effusion cells 200 when growing simple compounds such as elemental materials or simple binary compounds, or when growing compounds whose constituents approximately obey Raoult's or Henry's laws as described subsequently herein. In this case, even numbers of diametrically opposed effusion cells 200 can satisfy the wafer uniformity criteria even without substrate rotation. Having the ability to both plasma clean the wafer and the deposition chamber 100 reduces the chances of particulates and contaminate introduction to the wafer. Additionally, the plasma formed by the plasma source 500 can be used to activate gases for processing, such as is common when depositing nitride or oxide films.

Figure 7:
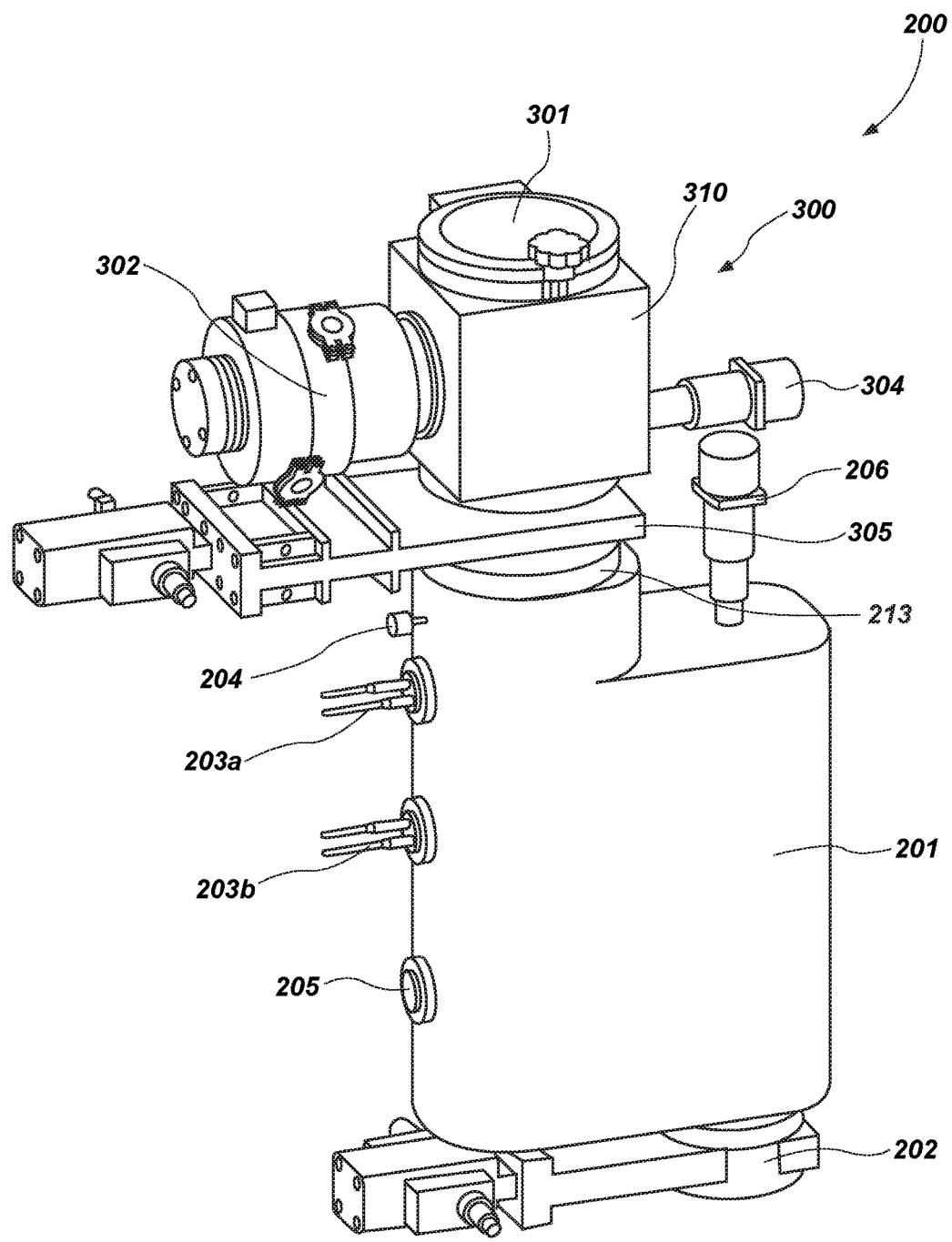
FIG. 7 is a top perspective view illustrating an effusion cell and in situ material load lock system that may be employed with the deposition systems of FIGS. 6A-6C.
Figure 8:
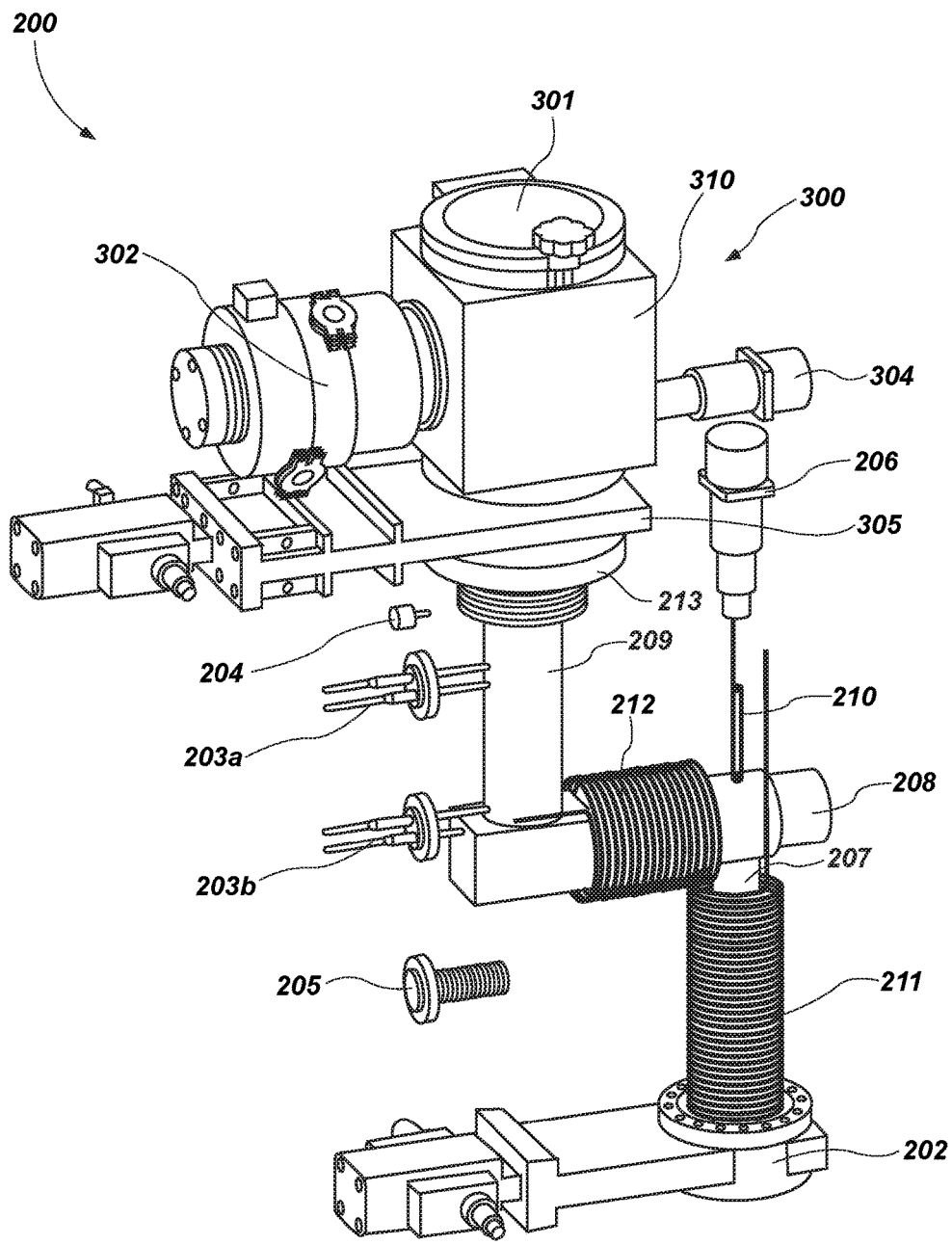
FIG. 8 is a simplified and schematically illustrated view illustrating the effusion cell of FIG. 7 with the outer housing and some electrical and plumbing connections removed for illustration of the material feed and delivery system that may be employed in accordance with embodiments of effusion cells of the present disclosure.
Figure 9A:
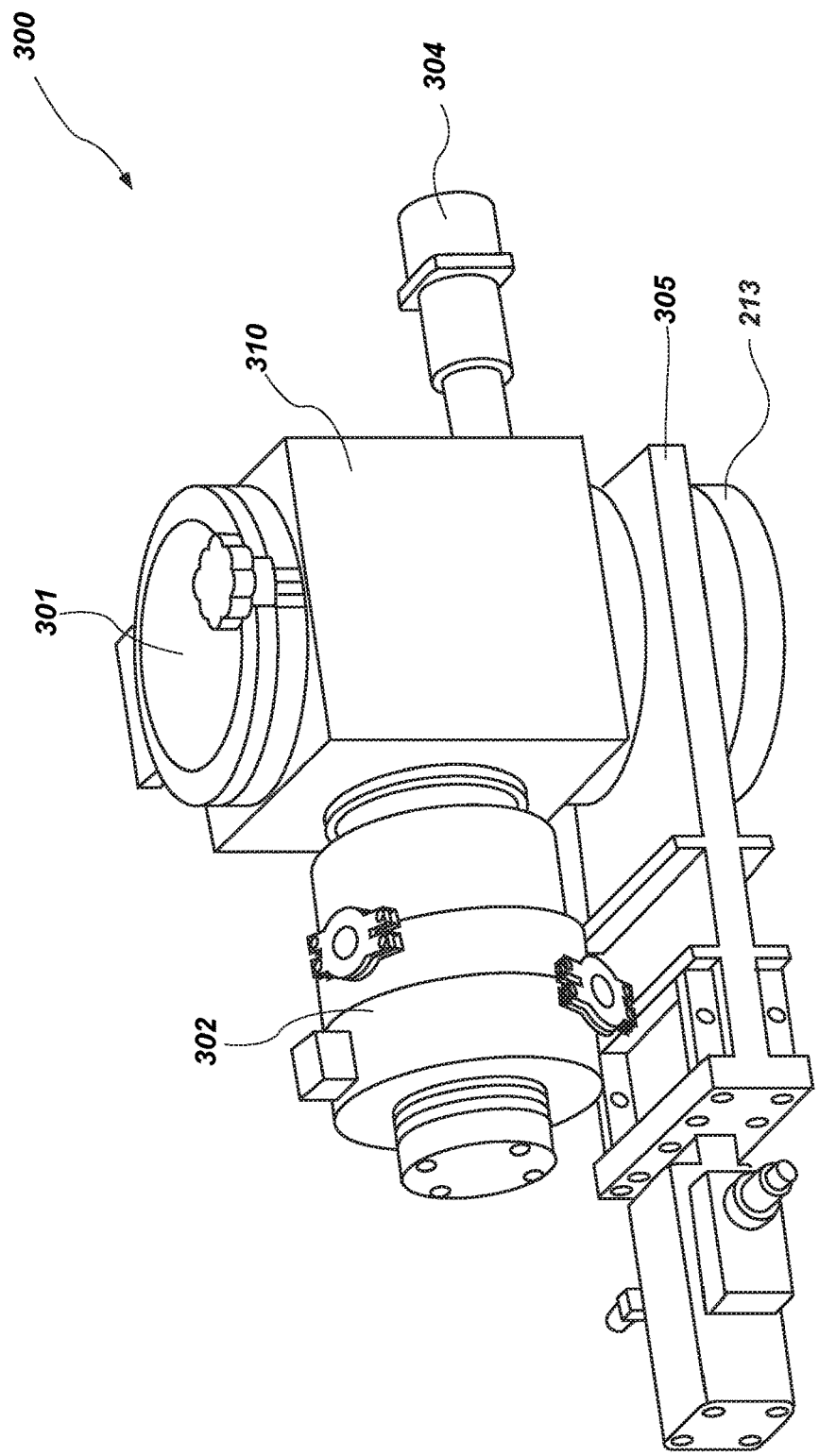
FIG. 9A is a close-up view of the in situ material loading system of the effusion cell of FIGS. 7 and 8.
Figure 9B:
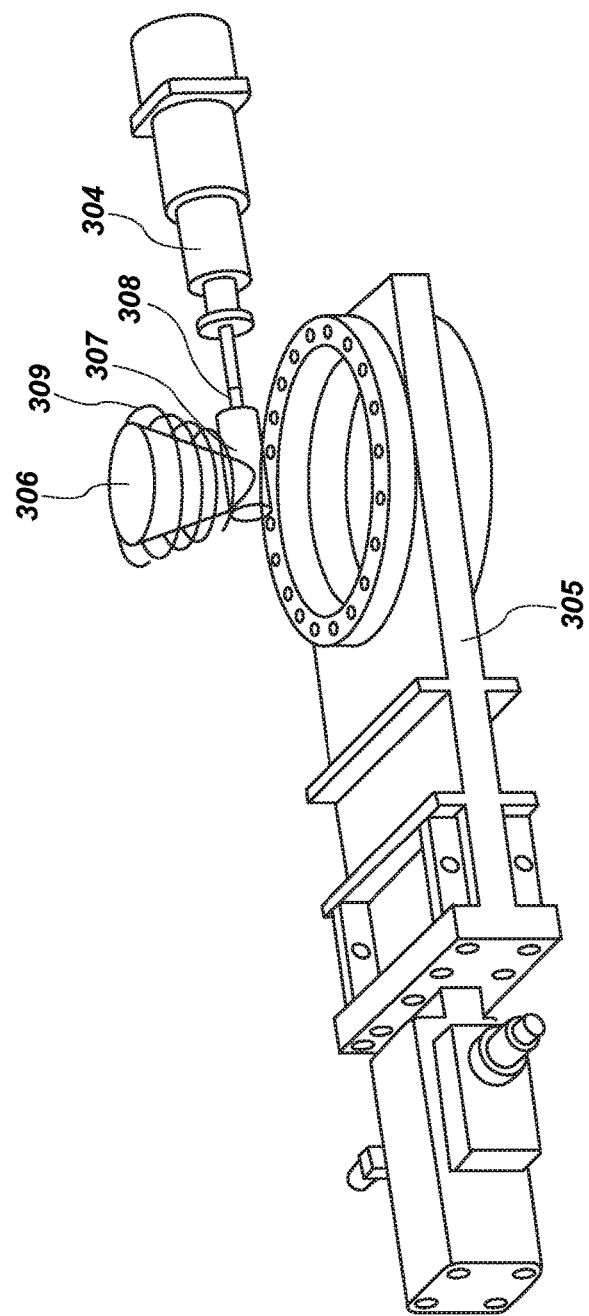
FIG. 9B is a simplified and schematically illustrated view of internal components of the in situ materials reloading mechanism of FIG. 9A showing a heated ball-cock reservoir and motor actuator in accordance with embodiments of effusion cells of the present disclosure.

FIGS. 6C, 7 and 8 further illustrate details of the effusion cells 200 that may be employed with deposition systems 10A, 10B as described herein. While these particular embodiments are for downward facing effusion cells 200 for use with upward facing wafers, the aforementioned U.S. Provisional Patent Application Ser. No. 62/327,323 provides details of embodiments for upward facing effusion cells.

Referring first to FIG. 8, the effusion cell 200 includes a crucible 208 configured to contain the material to be evaporated or sublimated within the effusion cell 200, and a delivery tube 207 configured to deliver evaporated or sublimated material originating from the crucible 208 out from the effusion cell 200 and into the deposition chamber 100. The effusion cell 200 further includes a supply tube 209 coupled to the crucible 208 for supplying additional material to the crucible 208 from outside the effusion cell 200. The effusion cell 200 includes an in situ material reloading system 300, which operates as a "load lock device" and includes an access port 301 and a vacuum pump 302. The load lock device 300 is coupled to the supply tube 209, and a vacuum gate valve 305 is disposed between the load lock device 300 and the supply tube 209.

Referring to FIGS. 7 and 8, the effusion cell 200 has an external vacuum tight housing 201, and an isolation valve 202 so as to allow the effusion cell 200 to be isolated from the deposition chamber 100 during times of maintenance, cleaning (in situ and maintenance). The effusion cell 200 further comprises at least one radio-frequency (RF) heating element 212 in the form of an induction coil located and configured to heat material contained in the crucible 208 so as to cause evaporation or sublimation of the material in the crucible 208 and flow of the evaporated or sublimated material through the delivery tube 207 and out from the effusion cell 200. The effusion cell 200 may further comprise another RF heating element 211 in the form of an induction coil located and configured to heat the delivery tube 207 (and material flowing therethrough). Independent RF feedthroughs 203a and 203b are provided to supply electrical excitation to the crucible 208 and delivery tube induction coil heating elements 211, 212. While these two heat zones may be heated by resistive filament heating elements, the use of RF induction heating elements reduces contamination, increases the operational pressure range of the system (resistive filaments can burn out at higher pressure) and can be utilized to provide heat shielding using a coil design, as is described in U.S. Provisional Patent Application Ser. No. 62/327,323. Thus, in some embodiments, the effusion cells 200 may not include any resistive heating elements.

Referring to FIGS. 7 and 8, an additional gas feedthrough 204 is also provided so as to allow a "curtain gas" to surround the exiting source material flowing out from the delivery tube 207. This curtain gas can be an inert gas used to adjust the mean free path between collisions (by adjusting local pressure in the evaporate stream) and, thus, tuning the conformal coverage of the evaporated flux. This curtain gas offers an additional mechanism beyond just the evaporate pressure to increase or decrease the step coverage as desired. Normally, evaporated PVD beams are deposited in a line of sight trajectory resulting in poor step coverage. Embodiments of the present disclosure can improve step coverage by using the randomized evaporate delivery trajectory associated with higher pressure gases. These higher pressures are achieved since the effusion cells 200 of the deposition systems 10A, 10B described herein can operate at extremely high temperatures compared to previous effusion sources, so as to produce high pressure evaporate "beams" along with the additional flexibility of local pressure control of the curtain gas. The effusion cell 200 also includes standard pressure sensors and electrical feedthroughs 205 and motorized source valve control 206.

The effusion cell 200 essentially acts as a one-way flow controller loaded from the in situ material reloading assembly 300 through a thermal isolator 213, through the internally baffled supply tube 209 into the heated crucible 208. The heated material in the crucible 208 is then evaporated or sublimated into the delivery tube 207, and the flow of the evaporated or sublimated material out from the delivery tube 207 is modulated by an internal rotational high speed valve and nozzle (as described in U.S. Provisional Patent Application Ser. No. 62/327,323) that is actuated by a valve shaft 210 and the motorized source valve control 206. The unidirectional travel of evaporate material is accomplished through a temperature gradient. In particular, the supply tube 209 is cool enough to condense evaporated or sublimated material in the supply tube 209, allowing it to liquefy and drain back into the crucible 208. Since the delivery tube 207 is the hottest of all parts in the effusion cell 200 (and may be substantially hotter than possible in previously known effusion cells), condensation cannot occur in the delivery tube 207 resulting in a delivered flux that is free of "spitting," even at high fluxes.

FIGS. 6C, 7, 8, 9A and 9B show various details of the in situ material reloading system 300 of the effusion cells 200. The in situ material reloading system 300 comprises a separate vacuum tight housing 310, which is evacuated by a vacuum pump 302, and is separated from the supply tube 209 by a vacuum gate valve 305. Reloading material (additional material to be evaporated or sublimated in the effusion cell 200) is introduced into the effusion cell 200 through an access port 301 and placed in a crucible 306 (FIG. 9B) that can be heated by heater element 309. Crucible 306 has a "Ball-Cock" style valve 307 integrally formed into the body of the crucible conical form. This valve body 307 (part of 306) has a rotational stem 308 actuated by a motor 304 such that when the introduced material is melted by heater element 309, a 90 degree rotation of the stem 308 opens up a hole in the Ball-Cock valve 307, allowing molten material to drain into the supply tube 209 through the opened vacuum gate valve 305 and the thermal isolator 213. The molten material flows through the baffled supply tube 209 into the crucible 208 (see FIG. 8) of the effusion cell 200.

Thus, in embodiments of effusion cells as disclosed herein, additional material to be evaporated or sublimated by the effusion cell 200 can be introduced into the in situ material reloading system 300, a vacuum may be created therein, the material may be sufficiently outgassed via the application of heat using the heater element 309, and then introduced into the crucible 208 of the effusion cell 200 without the crucible 208 ever being exposed to the external atmosphere. The effusion cell 200 is configured such that the effusion cell 200 can be filled with the material to be evaporated or sublimated without removing the effusion cell 200 from the deposition chamber 100 and without interrupting a deposition process performed using the deposition systems 10A, 10B. The crucible 208 can be filled with additional material to be evaporated or sublimated without interrupting evaporation or sublimation of material disposed within the effusion cell 200 and without releasing a vacuum within the deposition chamber 100. This offers a tremendous advantage over previously known effusion cells in campaign length, eliminating the need for costly maintenance cycles for reloading material common to MBE systems. In some embodiments, the vacuum pump 302 may optionally be used for differential pumping of the effusion cell 200.

The ability to continually re-supply material to the crucible 208 using the in situ material reloading system 300 enables a novel mode of operation. Specifically, when alloys or compound materials are to be deposited, the material loaded in the crucible 208 of the effusion cell 200 need not be elementally pure. For example, if an alloy or compound of Ga and Al is desired, both materials can be loaded in the same effusion cell and evaporated simultaneously as a Raoultian mixture wherein the vapor pressure of a component "A" (e.g., Al) in a solution of components "A" (e.g., Al) and "B" (e.g., Ga) at temperature T is equal to the product of the mole fraction of "A" (e.g., Al) in solution and the vapor pressure of pure component "A" (e.g., Al) at temperature T. This assumes that bond strength of "A" to "B," "A-B," differs little from the bond strength of "A-A" and "B-B" or is approximately the same as the average of "A-A" and "B-B" among other assumptions. These conditions are often satisfied within a single column of elements in the Periodic Table (e.g., column III including Ga, Al, and In). Under these conditions, the vapor pressure of the solution is the weighted (by mole fraction) linear combination of the two vapor pressures and is said to follow Raoult's law. Small deviations from the above assumptions will naturally lead to one component evaporating faster than the other. This condition is described by Henry's law which says the vapor pressure will be proportional to the mole fraction of the solute in the solution of "A" and "B." In practice, the actual vapor pressure will be somewhere in between the vapor pressures predicted by Raoult and Henry and can fluctuate as one component preferentially evaporates. This fluctuation is often minimal for elements in the same chemical family (i.e., same column or valence). This vapor pressure fluctuation has traditionally prevented the use of solutions in an effusion cell but is routinely compensated for in bulk crystal growth where one component may evaporate at a higher rate from the melt solution or where a dopant preferentially segregates to the liquid, resulting in doping gradients in the grown crystal unless compensated. By continually adding a small amount of one component more so than another, the melt composition can be predictably and accurately compensated for this small change. The in situ material reloading system 300 thus affords the Raoultian mixture mode of alloy evaporation.

Thus, in some embodiments, the material to be evaporated or sublimated disposed in the crucible 208 of the effusion cell 200 may comprise a mixture of two or more elemental materials. The mixture of the two or more elemental materials within the effusion cell 200 may have a predetermined elemental composition. The two or more elemental materials may comprise two or more elements from a common group of the Periodic Table.

The deposition chamber 100 may also contain various sensors, such as temperature sensors, pressure sensors, etc., and optionally may include additional pumping or process interrogatory ports so as to allow monitoring of various process parameters.

Figure 10:
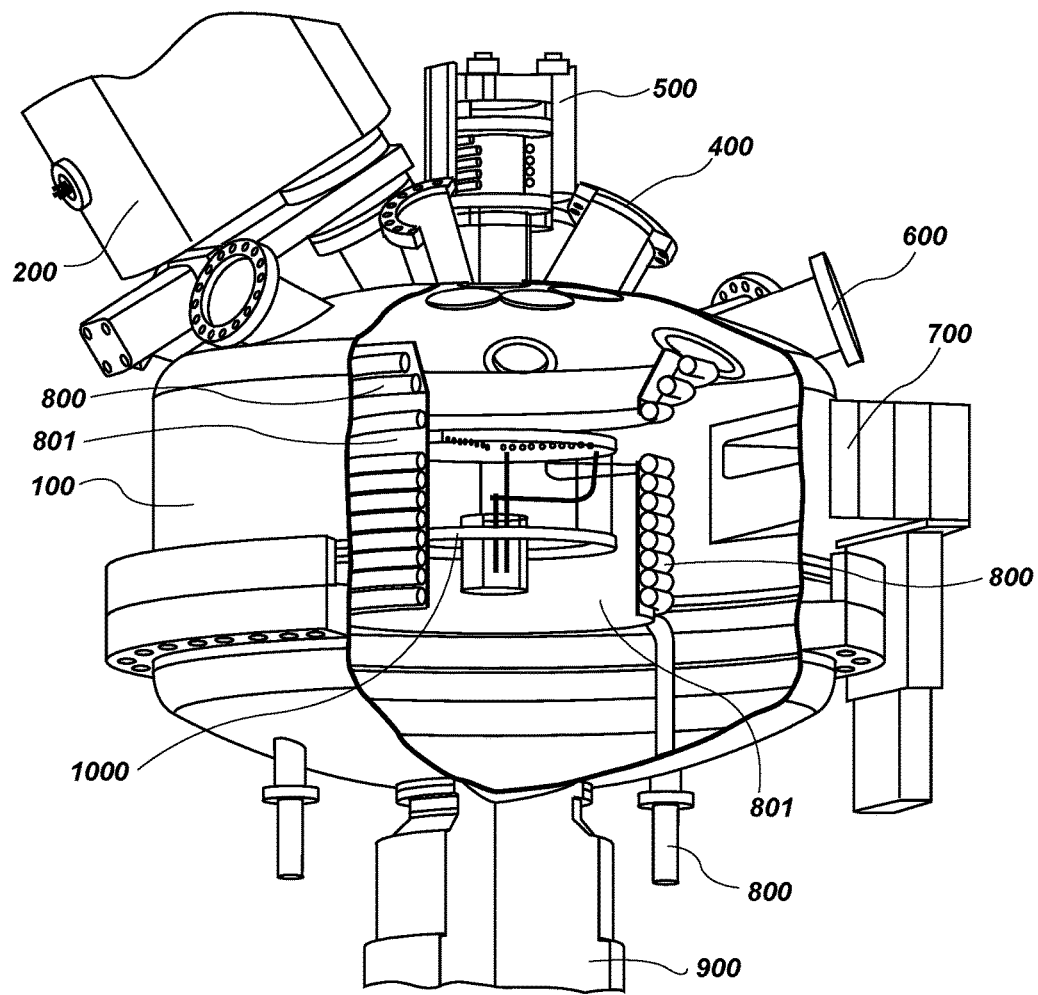
FIG. 10 is a partially cutaway perspective view of the deposition system of FIG. 6C illustrating internal components thereof.
Figure 11:
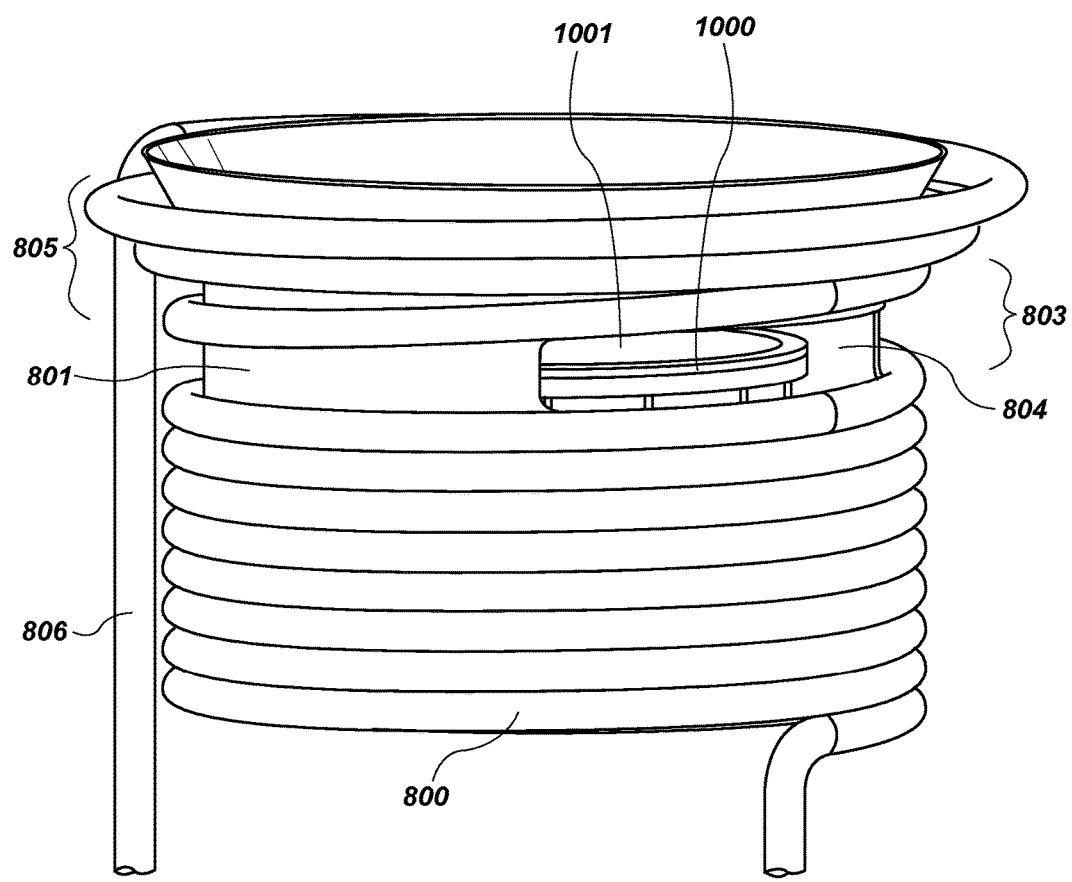
FIG. 11 is a perspective view of a coiled cooling tube, a cooling shield, and a semiconductor wafer placed on a heated wafer support structure, which may be employed in deposition systems of the present disclosure.

FIG. 10 shows a partially cutaway schematic illustration of one embodiment of a deposition system similar to that shown in FIG. 6C. The wafer transfer port 700 is shown, as well as a coiled cooling tube 800 and an attached heat shield 801. This coiled cooling tube 800 and attached heat shield 801 is shown in further detail in FIG. 11. Typical PVD systems, and especially MBE systems, use an elaborate liquid nitrogen or water/coolant cooled "cryopanel" that covers most internal surfaces. A cryopanel is a device having an inner and outer metal wall or surface containing a hollow chamber filled with a cooling liquid, such as liquid nitrogen, water, or other coolant. This cryopanel provides significant heat extraction removing heat introduced by the condensing hot gases. It also provides significant pumping capacity by condensation of impurity gases, but constitutes approximately ⅓ of the cost of manufacturing the MBE deposition chamber 100. The deposition systems of the present disclosure replace this expensive approach to cryopumping with a simpler, dramatically cheaper solution that may outperform the pumping capacity of legacy cryopanel designs by as much as a factor of three.

Thus, in the deposition systems 10A, 10B described herein, a simple coiled cooling tube 800 may be used, and the deposition systems 10A, 10B may not include a conventional cryopanel. The coiled cooling tube 800 is disposed within the deposition chamber 100, and the cooling tube 800 surrounds and encloses a volume of space within the deposition chamber 100 between the wafer support structure 1000 and the effusion cell 200. As summarized in Table 1 below, for a given geometry, a coiled cooling tube 800 has a much larger surface area (about 2.8 times as large) resulting in a higher pumping speed than a comparable sized cryopanel.

TABLE 1

|  | Cryopanel | Coiled Cooling Tube | Ratio |
| --- | --- | --- | --- |
| Diameter | 34" | 34" |  |
| Height | 24" | 24" |  |
| Thickness | 1" | 1" |  |
| Surface Area | 2,468" Square | 7,816" Square | 2.82 |
| Volume of Coolant | 2,488" Square | 1,479" Square | 0.59 |

Additionally, the coiled cooling tube 800 uses about 1.7 times less coolant relative to a conventional cryopanel because its internal volume is about 1.7 times smaller than a comparable cryopanel. Due to the complex machining and welding of a traditional cryopanel, the cost of the coiled cooling tube 800 approach is a few hundred dollars, whereas the cost for a typical research MBE reactor cryopanel ranges from about fifty thousand to one hundred thousand dollars.

While traditional growers of III-V semiconductor materials typically employ liquid nitrogen (LN2) as a coolant, the coiled cooling tube 800 approach also allows users to flow water, coolant or refrigerant (e.g., a chlorofluorocarbon) through the coiled cooling tube 800 when liquid nitrogen is not required. For example, LN2 may not be chosen as a coolant when growing oxides, metals or other relatively impure films, or films grown at high rates where background impurity incorporation is minimized or when initially developing materials that will not be used for devices. This flexibility allows for a dramatically lower operational cost when justified. Thus, the deposition systems 10A, 10B may include a source of cooling liquid, and a pump configured to pump the cooling liquid through the coiled cooling tube 800. The source of cooling liquid may comprise a source of liquid nitrogen, water, or a chlorofluorocarbon, for example.

Since some evaporates can be corrosive in some applications, and thus could damage the coiled cooling tube 800 resulting in coolant leaks, it may be prudent to optionally include a barrier heat shield 801 that is in thermal contact with the coiled cooling tube 800 to protect the coiled cooling tube 800 from significant evaporate deposition. The heat shield 801 may be cylindrical, for example, and may be disposed within the volume of space that is enclosed by the coiled cooling tube 800.

In order to facilitate wafer transfer, a gap 803 (FIG. 11) must be introduced in the coiled cooling tube 800 by spreading one coil and if the optional heat shield 801 is used, a corresponding gap 804 must be present in the heat shield 801. Finally for purposes of coolant return, the cryocoil may spiral outward (and the optional heat shield 801 may deflect outwards as in region 805 so as to allow the straight portion of a coolant return tube 806 to traverse outside the coiled cooling tube 800 and optional heat shield 801. The coiled cooling tube 800 and optional heat shield 801 surround the heated wafer support structure 1000 and the wafer 1001 supported thereon, thus absorbing much of the radiated heat from these components.

Figure 12A:
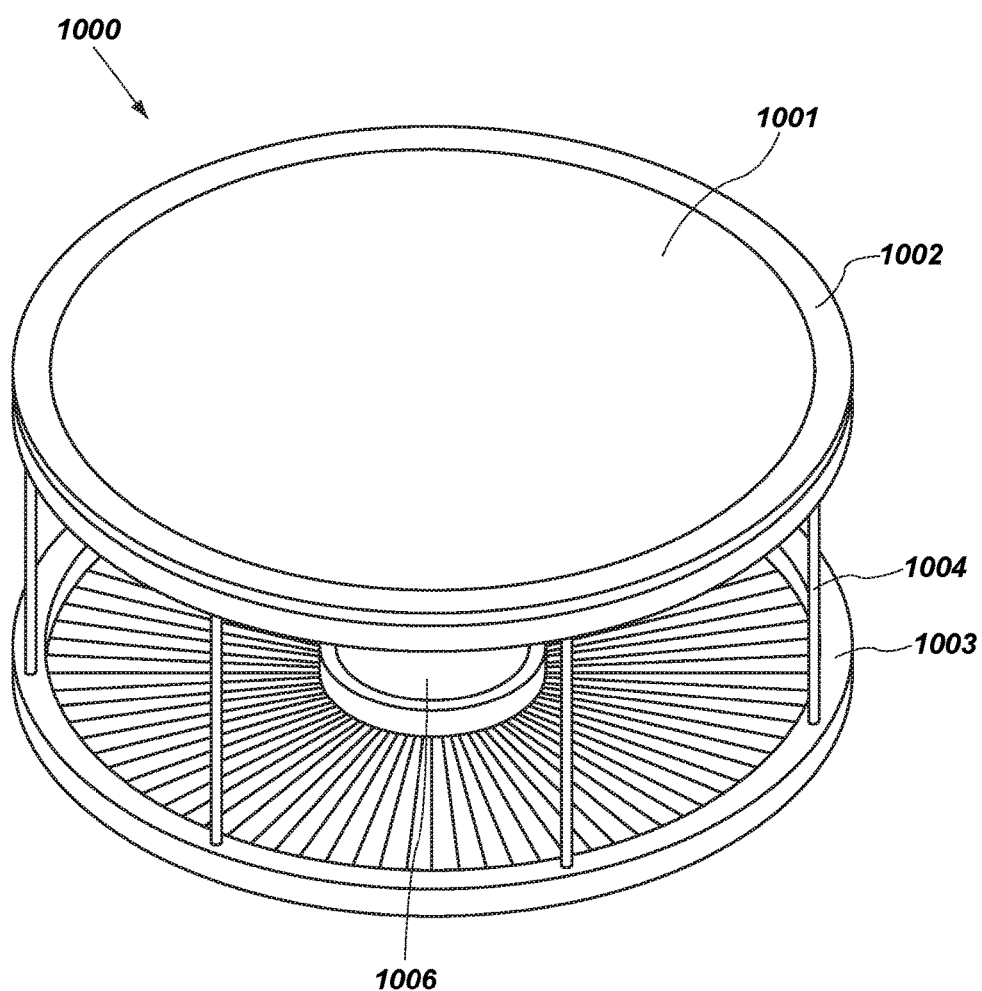
FIG. 12A is a top perspective view of a wafer disposed on a rotatable, heated wafer support structure, which may be employed in embodiments of deposition systems of the present disclosure.
Figure 12B:
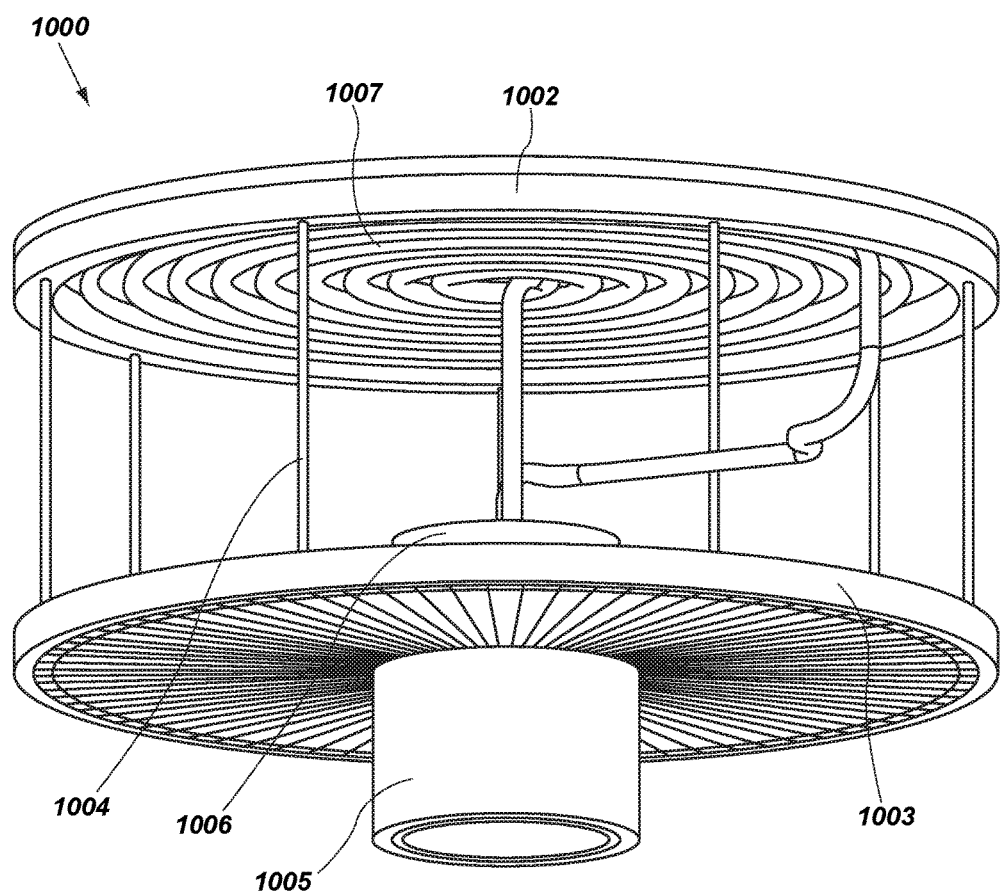
FIG. 12B is a bottom perspective view of the rotatable, heated wafer support structure of FIG. 12A.

FIGS. 12A and 12B illustrate a wafer support structure 1000, which may be disposed within the deposition chamber 100 of the deposition systems 10A, 10B and configured to support at least one wafer 1001 thereon. The wafer support structure 1000 may be heated, and may be configured to rotate the one or more wafers 1001 supported thereon during a deposition process. Although only one wafer 1001 is illustrated in the embodiment of FIGS. 12A and 12B, the wafer support structure 1000 may be sized and configured to support a plurality of wafers 1001 thereon in additional embodiments.

The wafer 1001 may be transferred into and out from the deposition chamber 100 through a transfer port and valve 700 (see FIG. 10). The wafer support structure 1000 may comprise a susceptor 1002, which may be raised and lowered in directions normal to the wafer-supporting face of the susceptor 1002. The susceptor 1002 may be rigidly mounted to a rotational platter 1003 by posts 1004. The posts 1004 may comprise material exhibiting relatively low thermal conductivity, such as a ceramic material, titanium, a refractory metal alloy, etc. The rotational platter 1003 is, in turn, affixed to a vertical actuation sleeve 1005. The raising and lowering of the susceptor 1002 to accept a transferred wafer is accomplished by raising and lowering the vertical actuation sleeve 1005 by means of any number of linear vacuum feedthrough actuators known in the art. The rotation of the wafer support structure 1000 (including susceptor 1002, platter 1003, posts 1004, and vertical actuation sleeve 1005 all affixed together) is accomplished by a separate rotational sleeve 1006 that becomes engaged with the vertical actuation sleeve 1005 via a spline connection (not shown in FIGS. 12A and 12B) when the wafer support structure 1000 is in the lowered position within the deposition chamber 100. Thus, the wafer support structure 1000 is free to elevate and lower to accept a wafer 1001 from the transfer system, and to lower that wafer 1001 into proximity of a fixed heating element 1007 while connecting to the rotational sleeve 1006 to provide rotational motion. Likewise, the rotational motion is coupled to the rotational sleeve 1006 by means of any number of rotational vacuum feedthrough actuators well known in the art. The heater element 1007 may be an RF induction coil, a standard resistive heating filament, a gas shielded resistive heating filament (where the gas flow protects the filament from oxidation or corrosion) or a resistive filament embedded in a protective ceramic coating.

In embodiments of deposition systems 10A, 10B as described herein, the wafer support structure 1000 and the one or more effusion cells 200 may be positioned and oriented relative to one another as previously described herein with reference to FIGS. 2A, 2B, 3 and 4.

In some applications, it may be desirable to provide an activated gas within the deposition chamber 100 of the deposition systems 10A, 10B. Such an activated gas may comprise a plasma delivered into the deposition chamber 100 from a plasma source. While a majority of PVD systems employing plasmas use "direct plasmas" in which the plasma gas atoms, which have high kinetic energy, "directly" bombard the deposition substrate (e.g., wafer), this may be undesirable for many semiconductor films as the bombardment may introduce substantial lattice damage to semiconductor crystals, substantially lowering device performance. Thus, it may be desirable to separate the high kinetic energy plasma from the semiconductor wafer. In embodiments of the present disclosure, this "plasma isolation" may be performed in two ways: 1) the plasma may be contained in a relatively high pressure crucible in which frequent gas collisions lower the average kinetic energy through statistical randomization and thermalization of energy; and/or 2) since the deposition systems 10A, 10B as described herein are capable of operating at substantially higher pressures than previous evaporative PVD systems, the path from the isolated plasma to the substrate allows for sufficient gas phase collisions to lower the average kinetic energy of the plasma gas atoms.

Figure 13A:
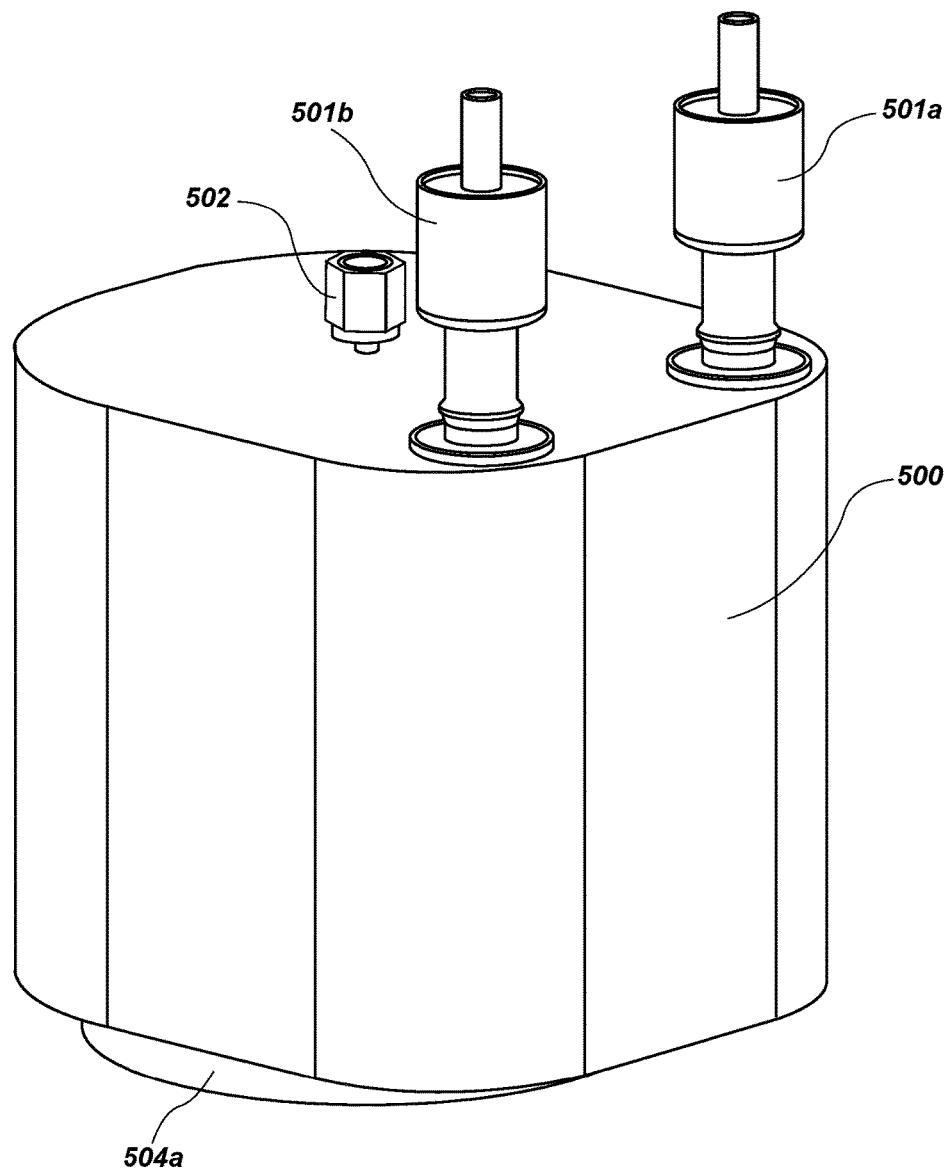
FIG. 13A is a top perspective view of an externally mounted RF plasma source that may be employed in embodiments of deposition systems of the present disclosure.
Figure 13B:
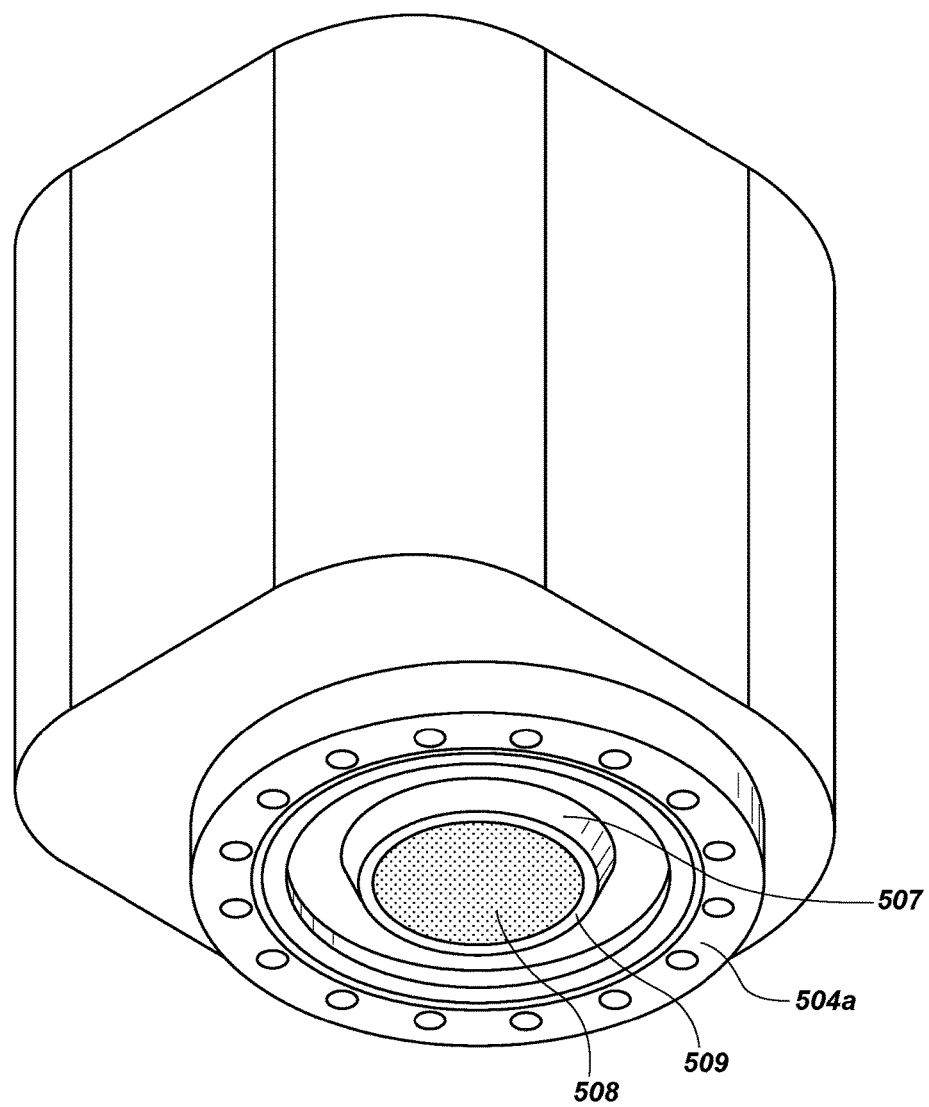
FIG. 13B is a bottom perspective view of the externally mounted RF plasma source of FIG. 13A.

FIGS. 13A and 13B illustrate an example embodiment of a plasma source 500 that may be employed with deposition systems 10A, 10B as described herein. The plasma source 500 combines an external coil design common in plasma CVD and plasma etching systems with the conductance limitations, and gas directional control of aperture plates common in MBE systems. External coil designs normally have open ended designs allowing maximum ion escape and extremely high gas throughput. Contrarily, plasma MBE systems use a coil that is inserted into the deposition chamber 100 (internal design) and utilize a conductance limiting aperture plate that builds up a pressure in a remote crucible sufficient to support a plasma.

Figure 13C:
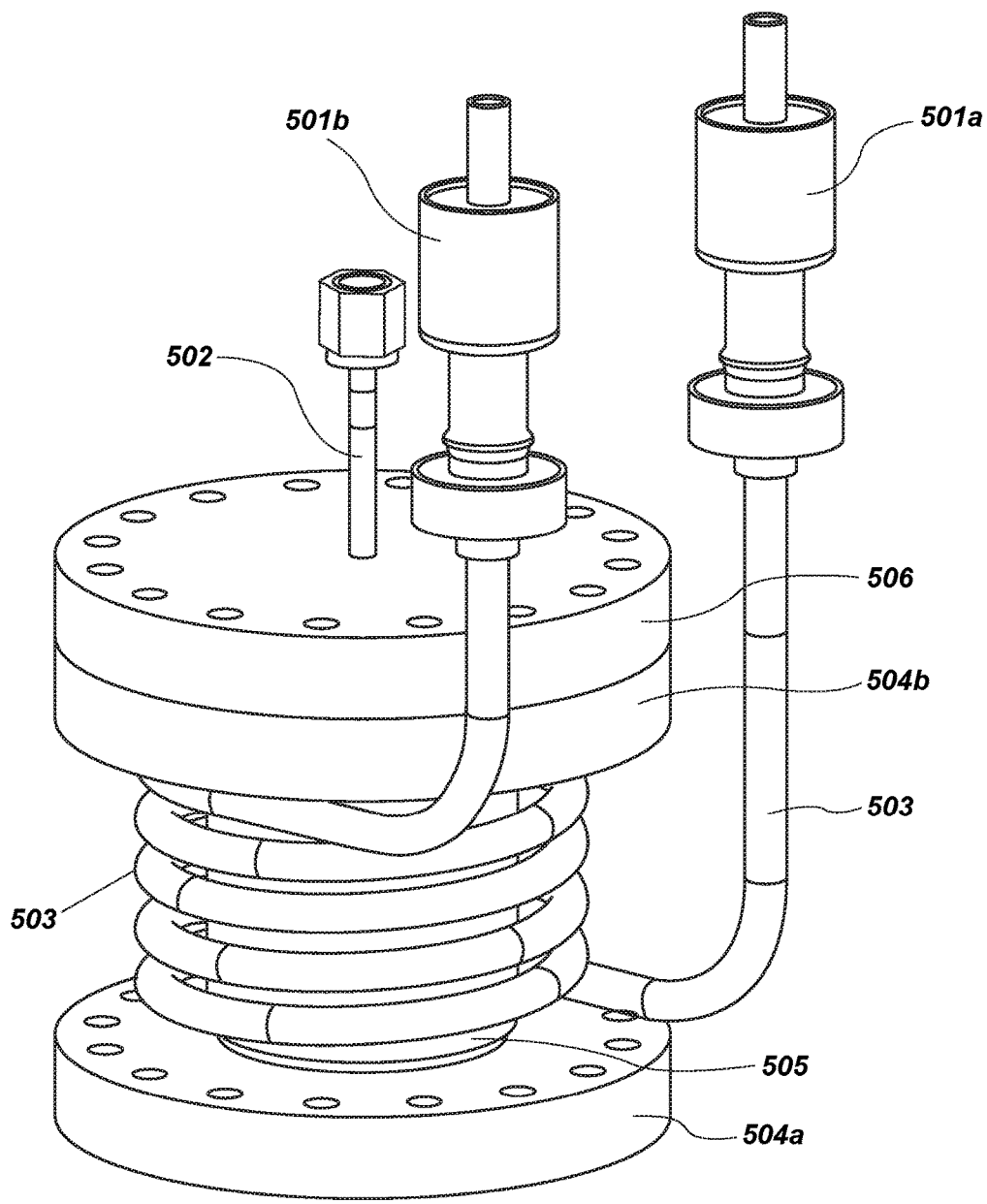
FIG. 13C is a top perspective view of the externally mounted RF plasma source of FIGS. 13A and 13B with the outer housing removed so as to show internal components thereof.
Figure 13D:
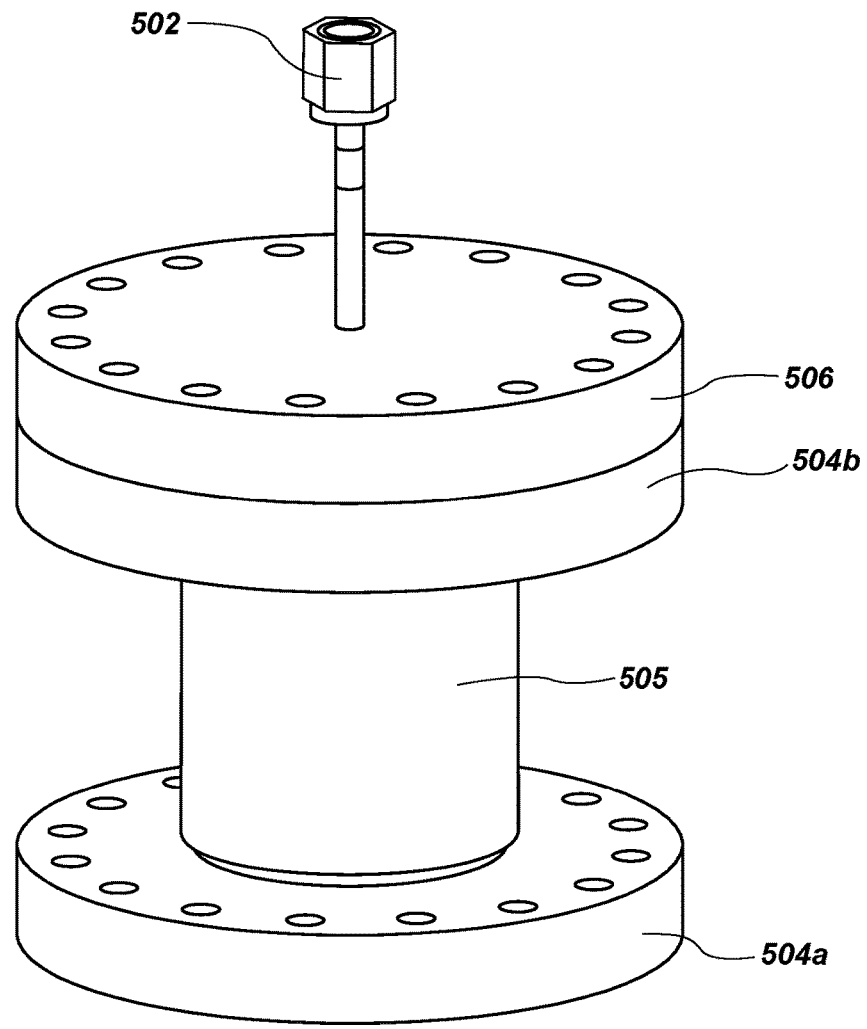
FIG. 13D is a top perspective view of the externally mounted RF plasma source of FIGS. 13A-13C with additional components removed so as to show internal components thereof.
Figure 13E:
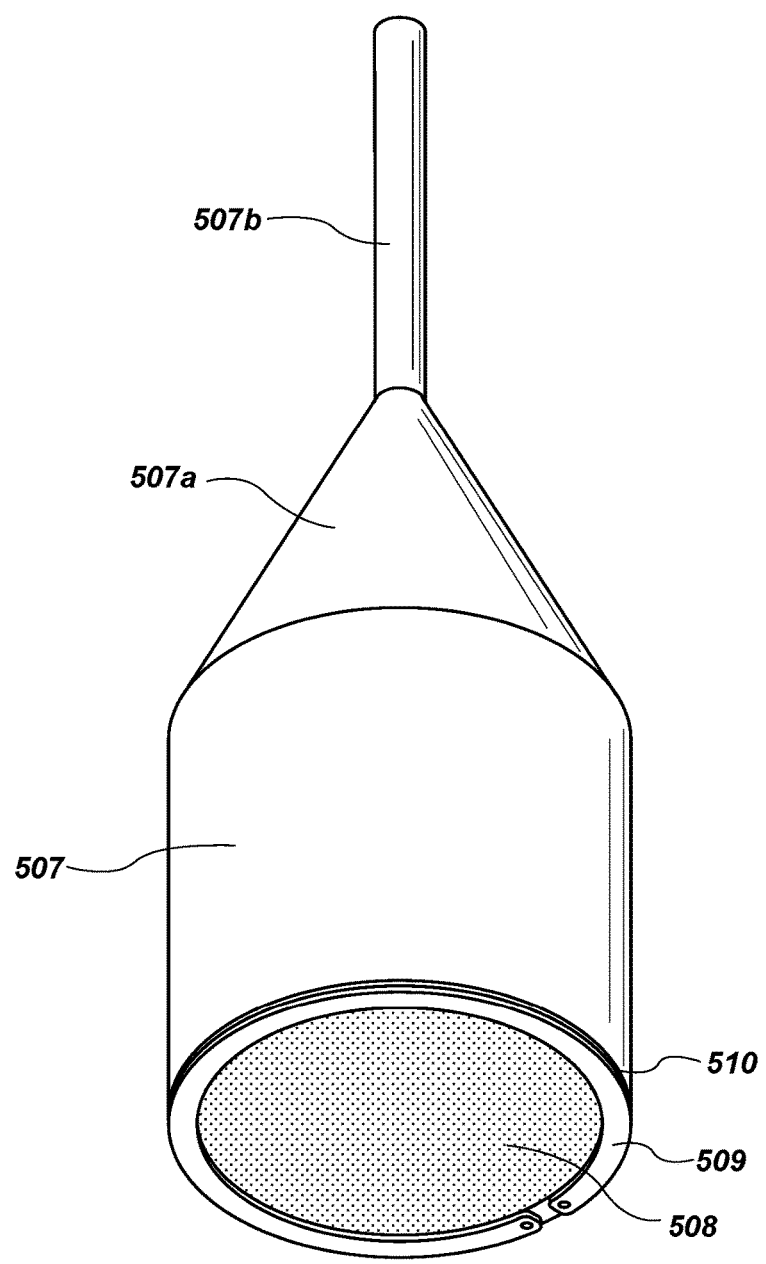
FIG. 13E is a perspective view of an RF plasma source containment crucible and gas delivery tube that may be employed in embodiments of deposition systems of the present disclosure.
Figure 13F:
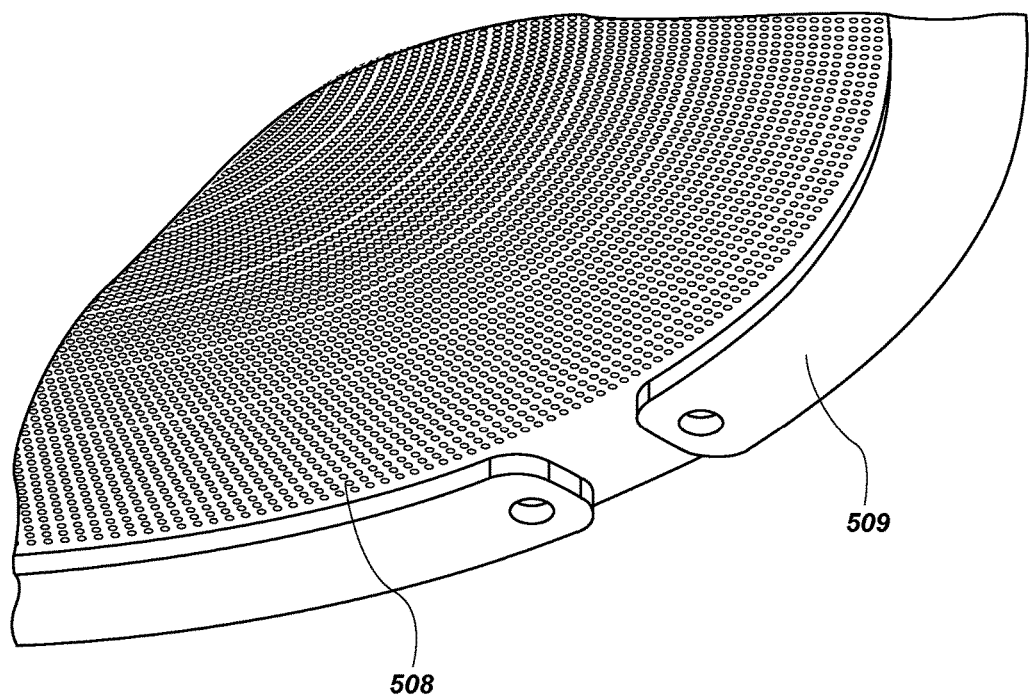
FIG. 13F is an enlarged perspective view of a portion of the RF plasma source containment crucible's conductance limiting aperture and snap ring for retaining the aperture.

FIG. 13C illustrates the plasma source 500 with the external cover removed so as to expose the plasma coil 503 and dielectric interface tube 505 (more clearly seen in FIG. 13D with the RF coil removed). The internal plasma crucible 507 shown in FIG. 13E is surrounded by the dielectric interface tube 505, and the plasma coil 503 surrounds the dielectric interface tube 505. The plasma source 500 includes a supply RF feedthrough 501*a* and a return RF feedthrough 501*b*, which are coupled to opposing ends of the externally mounted RF coil 503. One end (507b in FIG. 13E) of the plasma crucible 507 is hermetically affixed to the vacuum mounting flange 504b (FIG. 13C), and the opposing end of the plasma crucible 507 is attached to another vacuum mounting flange 504a. The plasma source 500 includes a gas feedthrough inlet 502, which is hermetically affixed to vacuum flange 506 (FIG. 13C) and feeds into the internal plasma crucible 507 (see FIG. 13E) as discussed in further detail below. The RF energy generated by the RF coil 503 is transmitted through the dielectric interface tube 505 (FIG. 13D) and the plasma crucible 507 (FIG. 13E) so as to energize the atoms of the gas fed into the plasma crucible 507 so as to generate a plasma gas within the plasma crucible 507.

Since the depositions systems 10A, 10B disclosed herein may enable deposition of very high purity semiconductor materials, the internal plasma crucible 507 shown in FIG. 13E isolates the plasma from surrounding metals and other possible sources of contamination that can be sputtered by the energetic plasma. Likewise, the internal plasma crucible 507 may be constructed of high purity ceramic material and may be compatible with the chosen application. In the case of III-nitride semiconductors, the crucible 507 may be constructed of pyrolytic boron nitride (PBN) or aluminum nitride (AlN) might be selected. The crucible 507 may be constructed of quartz or alumina for the deposition of oxide materials, for example.

With continued reference to FIG. 13E, gas feedthrough inlet 502 (FIG. 13A) hermetically connects to the narrow tube 507b of the plasma crucible 507. This narrow tube 507b not only delivers the gas through an expansion cone 507a to the cylindrically shaped crucible 507, but the narrow passage 507b also prevents the backflow of the plasma into a metallic tube of gas feedthrough inlet 502 where it could sputter contaminates.

The high velocity and pressure of the gas when flowing through the narrow passage 507b cannot support a plasma, and, thus, extinguishes the backflow of plasma. Sufficient backpressure so as to support a plasma is built up inside the plasma crucible 507 via a gas conductance restriction created by a perforated aperture plate 508, which is rigidly clamped in tight contact to the plasma crucible 507 by any number of attachment mechanisms including, but not limited to, the use of a snap ring 509 inserted into a recess 510 formed in an inner surface of the wall of the plasma crucible 507.

The gas conductance of the aperture plate 508 is calculated so as to achieve the maximum sustainable plasma pressure (typically 50 mTorr to 500 mTorr) for the desired gas flow for the system according to Equations 1-10 above, while maintaining as small of an orifice diameter as possible so as to promote, via solid-gas collisions, ion recombination upon exiting the aperture plate 508. Since the hole size of the orifice is fixed to as small as practically achievable (for example, a #80 drill size or smaller), the conductance of the aperture plate 508 can be controlled by the number of holes drilled, ranging from about 200 to 20,000 for a small wafer research system to a large 300 mm production system. Additionally each of these holes can be splayed so as to direct the plasma distributed uniformly across a wafer.

The incorporation of a plasma source 500 also affords the introduction of a plasma cleaning procedure for the depositions systems 10A, 10B, using any number of reactive etching gases known in the art (the appropriate cleaning gas depending upon the application) for the routine cleaning of the deposition chamber 100 or the wafer 1001 to be processed. By simply converting from deposition gas to the cleaning gas, the plasma may be used to maintain the deposition chamber 100 in pristine clean condition with minimal added downtime.

Additionally, it is known that over very long operational times, various plasma crucibles can erode over time due to plasma ion bombardment of the crucible walls and aperture plates. This erosion tends to leave behind a residue (powder) that becomes trapped in the crucible (due to the limited orifice size), increases the effective solid surface area inside the plasma crucible, and thus increases ion-electron recombination, which lowers the plasma density and reduces the deposition rate. In embodiments of the present disclosure, a means is afforded to reverse the gas flow, directing gas from the effusion cells 200 to the plasma and out through a waste valve connected in parallel to the plasma source gas supply. In this way, a routine gas reversal cycle can effectively prevent the buildup of eroded residue inside the crucible, preventing process contamination, and eliminating deposition rate degradation.

Additional non-limiting example embodiments of the present disclosure are set forth below.

Embodiment 1

A physical vapor deposition system, comprising: a deposition chamber; a wafer support structure disposed within the deposition chamber and configured to support at least one wafer thereon; and at least one effusion cell disposed at least partially outside the deposition chamber and coupled to a wall of the deposition chamber, the at least one effusion cell configured to generate physical vapor by evaporation or sublimation of material within the at least one effusion cell, and to inject the physical vapor into the deposition chamber through an aperture in the wall of the deposition chamber, and wherein the at least one effusion cell is configured such that the at least one effusion cell can be filled with the material to be evaporated or sublimated without removing the at least one effusion cell from the deposition chamber and without interrupting a deposition process performed using the deposition system.

Embodiment 2

The physical vapor deposition system of Embodiment 1, wherein the at least one effusion cell comprises: at least one crucible configured to contain the material to be evaporated or sublimated within the at least one effusion cell; and a delivery tube configured to deliver evaporated or sublimated material originating from the at least one crucible out from the at least one effusion cell and into the deposition chamber.

Embodiment 3

The physical vapor deposition system of Embodiment 2, wherein the at least one effusion cell further comprises at least one radio-frequency (RF) heating element located and configured to heat material contained in the at least one crucible so as to cause evaporation or sublimation of the material in the at least one crucible and flow of the evaporated or sublimated material through the delivery tube and out from the at least one effusion cell.

Embodiment 4

The physical vapor deposition system of Embodiment 2 or Embodiment 3, wherein the at least one effusion cell does not include any resistive heating elements.

Embodiment 5

The physical vapor deposition system of any one of Embodiments 2 through 4, wherein the at least one effusion cell further comprises: a supply tube coupled to the at least one crucible for supplying additional material to the at least one crucible from outside the at least one effusion cell; a load lock device including an access port and a vacuum pump, the load lock device coupled to the supply tube; and a valve between the load lock device and the supply tube.

Embodiment 6

The physical vapor deposition system of any one of Embodiments 2 through 5, wherein the at least one effusion cell is configured such that the at least one crucible can be filled with additional material to be evaporated or sublimated without interrupting evaporation or sublimation of material disposed within the at least one effusion cell and without releasing a vacuum within the deposition chamber.

Embodiment 7

The physical vapor deposition system of any one of Embodiments 2 through 6, further comprising material to be evaporated or sublimated within the at least one crucible, and wherein the material to be evaporated or sublimated comprises a mixture of two or more elements having a predetermined stoichiometric ratio.

Embodiment 8

A physical vapor deposition system, comprising: a deposition chamber; a wafer support structure disposed within the deposition chamber and configured to support at least one wafer thereon; at least one effusion cell configured to generate physical vapor by evaporation or sublimation of material within the at least one effusion cell, and to provide the physical vapor within the deposition chamber; and a coiled cooling tube disposed within the deposition chamber, the coiled cooling tube surrounding and enclosing a volume of space within the deposition chamber over the wafer support structure and between the wafer support structure and the at least one effusion cell.

Embodiment 9

The physical vapor deposition system of Embodiment 8, further comprising a source of cooling liquid, and a pump configured to pump the cooling liquid through the coiled cooling tube.

Embodiment 10

The physical vapor deposition system of Embodiment 9, wherein the source of cooling liquid comprises a source of liquid nitrogen, water, or a chlorofluorocarbon.

Embodiment 11

The physical vapor deposition system of any one of Embodiments 8 through 10, wherein the physical vapor deposition system does not include a cryopanel.

Embodiment 12

The physical vapor deposition system of any one of Embodiments 8 through 11, further comprising a cylindrical heat shield disposed within the volume of space enclosed by the coiled cooling tube.

Embodiment 13

A physical vapor deposition system, comprising: a deposition chamber; a wafer support structure disposed within the deposition chamber and configured to support at least one wafer thereon; at least one effusion cell configured to generate physical vapor by evaporation or sublimation of material within the at least one effusion cell, and to provide the physical vapor within the deposition chamber; and a mixture of two or more elemental materials to be evaporated or sublimated within the at least one effusion cell.

Embodiment 14

The physical vapor deposition system of Embodiment 13, wherein the mixture of the two or more elemental materials within the at least one effusion cell has a predetermined elemental composition.

Embodiment 15

The physical vapor deposition system of Embodiment 13 or Embodiment 14, wherein the two or more elemental materials comprise two or more elements from a common group of the Periodic Table.

Embodiment 16

The physical vapor deposition system of any one of Embodiments 13 through 15, wherein the two or more elemental materials comprise two or more elements from Group III of the Periodic Table.

Embodiment 17

The physical vapor deposition system of any one of Embodiments 13 through 16, wherein the at least one effusion cell is disposed at least partially outside the deposition chamber.

Embodiment 18

The physical vapor deposition system of any one of Embodiments 13 through 17, wherein the at least one effusion cell comprises: at least one crucible configured to contain the material to be evaporated or sublimated within the at least one effusion cell; and a delivery tube configured to deliver evaporated or sublimated material originating from the at least one crucible out from the at least one effusion cell and into the deposition chamber.

Embodiment 19

The physical vapor deposition system of Embodiment 18, wherein the at least one effusion cell further comprises at least one radio-frequency (RF) heating element located and configured to heat material contained in the at least one crucible so as to cause evaporation or sublimation of the material in the at least one crucible and flow of the evaporated or sublimated material through the delivery tube and out from the at least one effusion cell.

Embodiment 20

The physical vapor deposition system of Embodiment 18 or Embodiment 19, wherein the at least one effusion cell does not include any resistive heating elements.

Embodiment 21

The physical vapor deposition system of any one of Embodiments 18 through 20, wherein the at least one effusion cell is configured such that the at least one crucible can be filled with the material to be evaporated or sublimated without removing the at least one effusion cell from the deposition chamber.

Embodiment 22

The physical vapor deposition system of any one of Embodiments 18 through 21, wherein the at least one effusion cell is configured such that the at least one crucible can be filled with additional material to be evaporated or sublimated without interrupting evaporation or sublimation of material disposed within the at least one effusion cell and without releasing a vacuum within the deposition chamber.

Embodiment 23

A physical vapor deposition system, comprising: a deposition chamber; a wafer support structure disposed within the deposition chamber and configured to support at least one wafer thereon; and at least two effusion cells, the at least two effusion cells being diametrically opposed relative to a central axis of the wafer support structure and located a distance from the center of a support surface of the wafer support structure, a ratio of the distance to a diameter of the wafer support structure being between about 0.5 and about 2.0, each effusion cell of the at least two effusion cells located a lateral distance from a central axis of the wafer support structure.

Embodiment 24

The physical vapor deposition system of Embodiment 23, further comprising one or more additional effusion cells located a distance from the center of the support surface of the wafer support structure and a lateral distance from a central axis of the wafer support structure.

Embodiment 25

The physical vapor deposition system of Embodiment 23 or Embodiment 24, wherein each effusion cell of the at least two effusion cells is oriented and configured to emit matter toward the substrate support structure at an angle relative to the central axis of the wafer support structure.

Embodiment 26

The physical vapor deposition system of any one of Embodiments 23 through 25, wherein a ratio of the lateral distance to a diameter of the wafer support structure is between about 0.4 and 0.8.

Embodiment 27

The physical vapor deposition system of any one of Embodiments 23 through 26, wherein the physical vapor deposition comprises a molecular beam epitaxy deposition system.

Embodiment 28

The physical vapor deposition system of any one of Embodiments 23 through 27, wherein an average total flux of matter emitted from the at least two effusion cells across the upper surface of the wafer support structure is greater than about $1.0 \times 10^{15}$ atoms/cm²·second.

Embodiment 29

The physical vapor deposition system of any one of Embodiments 23 through 28, further comprising a plasma source coupled to the deposition chamber and configured to generate plasma within the deposition chamber.

Embodiment 30

The physical vapor deposition system of any one of Embodiments 23 through 29, further comprising a coiled cooling tube disposed within the deposition chamber and laterally surrounding the substrate support structure.

Embodiment 31

A method of performing a physical vapor deposition process, comprising: emitting matter from at least one effusion cell disposed at least partially outside a deposition chamber through an aperture in a wall of the deposition chamber and toward at least one wafer on a wafer support structure within the deposition chamber; and depositing the emitted matter on the at least one wafer.

Embodiment 32

The method of Embodiment 31, further comprising providing a pressure of between about 760 torr and about $1 \times 10^{-8}$ torr within the deposition chamber while depositing the emitted matter on the at least one wafer.

Embodiment 33

The method of Embodiment 32, further comprising providing a pressure of between about 760 torr and about $1 \times 10^{-2}$ torr within the deposition chamber while depositing the emitted matter on the at least one wafer.

Embodiment 34

The method of Embodiment 33, further comprising providing a viscous flow or a mixed flow of the emitted matter through the deposition chamber while depositing the emitted matter on the at least one wafer.

Embodiment 35

The method of any one of Embodiments 31 through 34, wherein depositing the emitted matter on the at least one wafer comprises growing a layer of the matter on the at least one wafer, the layer having a layer thickness uniformity of between 0.1% and 1%.

Embodiment 36

The method of any one of Embodiments 31 through 35, further comprising depositing at least 30% of the emitted matter onto the at least one wafer.

Embodiment 37

The method of any one of Embodiments 31 through 36, further comprising growing a layer of the emitted matter on the at least one wafer at a growth rate of between about 10 μm/hour and about 50 μm/hour.

Embodiment 38

The method of any one of Embodiments 31 through 37, further comprising heating matter within the at least one effusion cell using at least one radio-frequency (RF) heating element to a temperature between 1,200° C. and 2,500° C. to cause evaporation or sublimation of the material and emit the evaporated or sublimated material out from the at least one effusion cell.

Embodiment 39

A method of performing a physical vapor deposition process, comprising: emitting matter from each of two effusion cells toward at least one wafer on a wafer support structure within a deposition chamber, the two effusion cells being diametrically opposed relative to a central axis of the wafer support structure and located a distance from the center of a support surface of the wafer support structure, a ratio of the distance to a diameter of the wafer support structure being between about 0.5 and about 2.0, each effusion cell of the two effusion cells located a lateral distance from a central axis of the wafer support structure; and depositing the emitted matter on the at least one wafer.

Embodiment 40

The method of Embodiment 39, further comprising providing an average total flux of matter emitted from the two effusion cells across the upper surface of the wafer support structure of greater than about $1.0 \times 10^{15}$ atoms/cm$^2$·second.

Embodiment 41

The method of Embodiment 39 or Embodiment 40, further comprising providing a pressure of between about 760 torr and about $1 \times 10^{-8}$ torr within the deposition chamber while depositing the emitted matter on the at least one wafer.

Embodiment 42

The method of Embodiment 41, further comprising providing a pressure of between about 760 torr and about $1 \times 10^{-2}$ torr within the deposition chamber while depositing the emitted matter on the at least one wafer.

Embodiment 43

The method of Embodiment 41 or Embodiment 42, further comprising providing a viscous flow or a mixed flow of the emitted matter through the deposition chamber while depositing the emitted matter on the at least one wafer.

Embodiment 44

The method of any one of Embodiments 39 through 43, wherein depositing the emitted matter on the at least one wafer comprises growing a layer of the matter on the at least one wafer, the layer having a layer thickness uniformity of between 0.1% and 1%.

Embodiment 45

The method of any one of Embodiments 39 through 44, further comprising depositing at least 30% of the emitted matter onto the at least one wafer.

Embodiment 46

The method of any one of Embodiments 39 through 45, further comprising growing a layer of the emitted matter on the at least one wafer at a growth rate of between about 10 μm/hour and about 50 μm/hour.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventor.

What is claimed is:

1. A physical vapor deposition system, comprising:
   a deposition chamber;
   a wafer support structure disposed within the deposition chamber and configured to support at least one wafer thereon; and
   at least one effusion cell disposed at least partially outside the deposition chamber and coupled to a wall of the deposition chamber, the effusion cell configured to generate physical vapor by evaporation or sublimation of material within the at least one effusion cell, and to inject the physical vapor into the deposition chamber through an aperture in the wall of the deposition chamber, and wherein the at least one effusion cell is configured such that the effusion cell can be filled with the material to be evaporated or sublimated without removing the at least one effusion cell from the deposition chamber and without interrupting a continuous deposition process performed using the deposition system, the at least one effusion cell comprising:
      a crucible configured to contain therein the material to be evaporated or sublimated;
      a delivery tube configured to deliver evaporated or sublimated material originating from the crucible out from the effusion cell and into the deposition chamber;
      a supply tube extending from and physically coupled to the crucible at a first end thereof, the supply tube located and configured to trap condensate originating from the evaporated or sublimated material and to deliver the condensate back to the crucible; and
      a vacuum housing enclosing each of the crucible, the delivery tube, and the supply tube; a load lock device including an access port and a vacuum pump; and
   a thermal isolator between the load lock device and the supply tube;

wherein a second end of the supply tube opposite the first end is open to the vacuum housing thereabout through the thermal isolator.

2. The physical vapor deposition system of claim 1, wherein the at least one effusion cell further comprises at least one radio-frequency (RF) heating element located and configured to heat material contained in the crucible so as to cause evaporation or sublimation of the material in the crucible and flow of the evaporated or sublimated material through the delivery tube and out from the effusion cell.

3. The physical vapor deposition system of claim 2, wherein the effusion cell does not include any resistive heating elements.

4. The physical vapor deposition system of claim 1, wherein the at least one effusion cell further comprises:
 a valve coupled to and located between the load lock device and the supply tube.

5. The physical vapor deposition system of claim 4, wherein the crucible extends between and is physically coupled to each of the delivery tube and the supply tube.

6. The physical vapor deposition system of claim 4, wherein the load lock device is located at a first end of the at least one effusion cell opposite a second end at which the at least one effusion cell is coupled to the wall of the deposition chamber.

7. The physical vapor deposition system of claim 1, wherein the effusion cell is configured such that the crucible can be filled with additional material to be evaporated or sublimated without interrupting evaporation or sublimation of material disposed within the at least one effusion cell and without releasing a vacuum within the deposition chamber.

8. The physical vapor deposition system of claim 1, further comprising a coiled cooling tube disposed within the deposition chamber, the coiled cooling tube surrounding and enclosing a volume of space within the deposition chamber between the wafer support structure and the at least one effusion cell.

9. The physical vapor deposition system of claim 8, further comprising a source of cooling liquid, and a pump configured to pump the cooling liquid through the coiled cooling tube.

10. The physical vapor deposition system of claim 9, wherein the source of cooling liquid comprises a source of liquid nitrogen, water, or a chlorofluorocarbon.

11. The physical vapor deposition system of claim 10, wherein the physical vapor deposition system does not include a cryopanel having an inner wall and an outer wall defining a hollow chamber therebetween configured to be filled with a cooling liquid.

12. The physical vapor deposition system of claim 8, further comprising a cylindrical heat shield disposed within the volume of space enclosed by the coiled cooling tube.

13. The physical vapor deposition system of claim 1, further comprising the material to be evaporated or sublimated disposed within the effusion cell, and wherein the material to be evaporated or sublimated comprises a mixture of two or more elemental materials.

14. The physical vapor deposition system of claim 13, wherein the mixture of the two or more elemental materials within the at least one effusion cell has a predetermined elemental composition.

15. The physical vapor deposition system of claim 14, wherein the two or more elemental materials comprise two or more elements from a common group of the Periodic Table.

16. The physical vapor deposition system of claim 1, wherein the at least one effusion cell comprises at least two effusion cells, the two effusion cells being diametrically opposed relative to a central axis of the wafer support structure and located a distance from the center of a support surface of the wafer support structure, a ratio of the distance to a diameter of the wafer support structure being between about 0.5 and about 2.0.

17. The physical vapor deposition system of claim 16, wherein each effusion cell of the at least two effusion cells is oriented and configured to emit matter toward the substrate support structure at an angle relative to the central axis of the wafer support structure.

18. The physical vapor deposition system of claim 17, wherein each effusion cell of the two effusion cells is located a lateral distance from the central axis of the wafer support structure, the lateral distance measured between the central axis and a location of the effusion cell at which the physical vapor is injected by the effusion cell into the deposition chamber, a ratio of the lateral distance to a diameter of the wafer support structure is between about 0.4 and 0.8.

19. The physical vapor deposition system of claim 1, wherein the delivery tube extends between and is physically coupled to the crucible and the wall of the deposition chamber.

20. The physical vapor deposition system of claim 1, wherein the thermal isolator is porous.

* * * * *